US012501806B2

(12) United States Patent
He et al.

(10) Patent No.: US 12,501,806 B2
(45) Date of Patent: Dec. 16, 2025

(54) DISPLAY SUBSTRATE AND DISPLAY DEVICE WITH SPECIAL-SHAPED SUB-PIXEL OPENING

(71) Applicants: Chengdu BOE Optoelectronics Technology Co., Ltd., Chengdu (CN); Beijing BOE Technology Development Co., Ltd., Beijing (CN)

(72) Inventors: Qing He, Beijing (CN); Xiaomin Yuan, Beijing (CN); Wenbo Chen, Beijing (CN); Qingqing Yan, Beijing (CN); Xiangnan Pan, Beijing (CN); Ge Wang, Beijing (CN); Zhiliang Jiang, Beijing (CN); Zaiyong Long, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 310 days.

(21) Appl. No.: 18/042,472

(22) PCT Filed: Jun. 24, 2022

(86) PCT No.: PCT/CN2022/101076
§ 371 (c)(1),
(2) Date: Feb. 22, 2023

(87) PCT Pub. No.: WO2023/245614
PCT Pub. Date: Dec. 28, 2023

(65) Prior Publication Data
US 2023/0422571 A1    Dec. 28, 2023

(51) Int. Cl.
*H10K 59/35*    (2023.01)
*H10K 59/122*    (2023.01)

(52) U.S. Cl.
CPC ......... *H10K 59/353* (2023.02); *H10K 59/122* (2023.02); *H10K 59/351* (2023.02); *H10K 59/352* (2023.02)

(58) Field of Classification Search
CPC ....... H10K 50/00–88; H10K 59/00–95; H10K 65/00; H10K 71/00–861;
(Continued)

(56) References Cited

U.S. PATENT DOCUMENTS 9,978,821 B2 *   5/2018   Tsai ..................... H10K 50/865
10,600,847 B2    3/2020   Hong et al.
(Continued)

FOREIGN PATENT DOCUMENTS

CN    207781608 U  *  8/2018  .......... G02F 1/1333
CN    108538884 A      9/2018
(Continued)

*Primary Examiner* — Scott B Geyer
(74) *Attorney, Agent, or Firm* — Westman, Champlin & Koehler, P.A.

(57) ABSTRACT

A display substrate and a display device are provided. The display substrate includes: a plurality of sub-pixels; a first electrode layer including a plurality of anode structures; and a pixel definition layer located on a side of the first electrode layer away from the base substrate and including a plurality of openings. For at least some sub-pixels, an orthographic projection of the opening of each sub-pixel falls into that of the anode structure of the sub-pixel on the base substrate, a figure of the orthographic projection of the opening of each sub-pixel has a different shape from a figure of the orthographic projection of the anode structure of the sub-pixel on the base substrate. The figure of the orthographic projection of the anode structure of each sub-pixel has more symmetry axis than the figure of the orthographic projection of the opening of the sub-pixel on the base substrate.

20 Claims, 16 Drawing Sheets

(58) Field of Classification Search
CPC . H10K 85/00–791; H10K 2101/00–90; H10K 2102/00–361; B32B 2457/206
See application file for complete search history.

(56) References Cited

U.S. PATENT DOCUMENTS

| | | | |
|---|---|---|---|
| 10,684,481 B2 | 6/2020 | Cho et al. | |
| 10,879,324 B2 | 12/2020 | Lee et al. | |
| 11,430,835 B2 | 8/2022 | Hong et al. | |
| 11,515,374 B2 | 11/2022 | Lee et al. | |
| 11,610,953 B2 | 3/2023 | Wen et al. | |
| 11,678,549 B2 | 6/2023 | Hong et al. | |
| 2005/0041188 A1* | 2/2005 | Yamazaki | G09G 3/3607 349/146 |
| 2009/0195144 A1* | 8/2009 | Kitabayashi | H10K 50/805 313/503 |
| 2010/0051958 A1* | 3/2010 | Izumida | H10K 59/80522 257/E33.053 |
| 2013/0153748 A1* | 6/2013 | Suzuki | H04N 25/136 250/208.1 |
| 2015/0048322 A1* | 2/2015 | So | H10K 59/131 257/40 |
| 2016/0071910 A1 | 3/2016 | Sasaki et al. | |
| 2016/0260792 A1* | 9/2016 | Kim | H10K 59/131 |
| 2017/0005286 A1 | 1/2017 | Yun et al. | |
| 2017/0236882 A1* | 8/2017 | Matsunaga | H10K 59/873 257/40 |
| 2018/0159064 A1* | 6/2018 | Wu | H10K 59/80515 |
| 2018/0254304 A1 | 9/2018 | Hong et al. | |
| 2018/0314067 A1 | 11/2018 | Cho et al. | |
| 2018/0350886 A1* | 12/2018 | An | H10K 59/123 |
| 2019/0064552 A1* | 2/2019 | Kim | H10K 59/1315 |
| 2019/0088904 A1 | 3/2019 | Cho et al. | |
| 2019/0363310 A1* | 11/2019 | Nakamura | H10K 59/352 |
| 2019/0371874 A1 | 12/2019 | Lee et al. | |
| 2019/0386221 A1* | 12/2019 | Jang | H10K 71/166 |
| 2020/0175900 A1* | 6/2020 | Han | H10K 71/70 |
| 2020/0185475 A1* | 6/2020 | Kim | H10K 59/131 |
| 2020/0219943 A1 | 7/2020 | Hong et al. | |
| 2020/0312942 A1* | 10/2020 | Yang | H10K 59/352 |
| 2020/0348520 A1 | 11/2020 | Cho et al. | |
| 2021/0167148 A1 | 6/2021 | Lee et al. | |
| 2021/0328199 A1 | 10/2021 | Yao et al. | |
| 2021/0376021 A1* | 12/2021 | Joo | H10K 59/8792 |
| 2021/0408153 A1* | 12/2021 | Sun | H10K 59/121 |
| 2022/0020827 A1* | 1/2022 | Liu | H10K 59/80516 |
| 2022/0069027 A1* | 3/2022 | Wang | H10K 50/813 |
| 2022/0130931 A1* | 4/2022 | Lim | H10K 59/1213 |
| 2022/0190055 A1 | 6/2022 | Lou et al. | |
| 2022/0208890 A1 | 6/2022 | Liu et al. | |
| 2022/0223663 A1 | 7/2022 | Wen et al. | |
| 2022/0262870 A1* | 8/2022 | Son | H10K 59/352 |
| 2022/0415975 A1 | 12/2022 | Hong et al. | |
| 2023/0057473 A1 | 2/2023 | Lee et al. | |

FOREIGN PATENT DOCUMENTS

| | | | | |
|---|---|---|---|---|
| CN | 108807467 A | | 11/2018 | |
| CN | 110556403 A | | 12/2019 | |
| CN | 111341815 A | | 6/2020 | |
| CN | 111341936 A | * | 6/2020 | .......... H01L 27/3211 |
| CN | 111952342 A | * | 11/2020 | .......... H01L 27/3216 |
| CN | 112331703 A | | 2/2021 | |
| CN | 112786813 A | | 5/2021 | |
| CN | 112864202 A | | 5/2021 | |
| CN | 110416267 B | * | 1/2022 | .......... G06F 30/392 |
| CN | 113889519 A | * | 1/2022 | ............ H10K 59/12 |
| WO | WO-2021217593 A1 | * | 11/2021 | .......... H01L 27/3234 |
| WO | WO-2022041203 A1 | * | 3/2022 | .......... H10K 59/1213 |

* cited by examiner

DISPLAY SUBSTRATE AND DISPLAY DEVICE WITH SPECIAL-SHAPED SUB-PIXEL OPENING

CROSS-REFERENCE TO RELATED APPLICATION(S)

This application is a Section 371 National Stage Application of International Application No. PCT/CN2022/101076, filed on Jun. 24, 2022, entitled "DISPLAY SUBSTRATE AND DISPLAY DEVICE", the content of which is incorporated herein by reference in its entirety.

TECHNICAL FIELD

The present disclosure relates to a field of a display technology, in particular to a display substrate and a display device.

BACKGROUND

Organic Light Emitting Display (OLED) is a type of self-luminescent device with a series of advantages such as low energy consumption, self-luminescence, high brightness, full view, fast response, flexible display, and so on. In recent years, OLED display devices have been widely used in watches, mobile phones, computers, televisions and other display devices having different sizes. A structure of an OLED display device mainly includes a base substrate and sub-pixels arrayed on the base substrate.

The above information disclosed in this section is merely for the understanding of the background of technical concepts of the present disclosure. Therefore, the above information may contain information that does not constitute a related art.

SUMMARY

In an aspect, a display substrate is provided, including: a base substrate; a plurality of sub-pixels arranged on the base substrate in an array in a first arrangement direction and a second arrangement direction, wherein the plurality of sub-pixels include a plurality of light emitting regions; a first electrode layer located on the base substrate, wherein the first electrode layer includes a plurality of anode structures; and a pixel definition layer located on a side of the first electrode layer away from the base substrate, wherein the pixel definition layer includes a plurality of openings to define the plurality of light emitting regions, wherein for at least some sub-pixels in the plurality of sub-pixels, an orthographic projection of the opening of each sub-pixel on the base substrate falls into an orthographic projection of the anode structure of the sub-pixel on the base substrate, a figure of the orthographic projection of the opening of each sub-pixel on the base substrate has a different shape from a figure of the orthographic projection of the anode structure of the sub-pixel on the base substrate; and the figure of the orthographic projection of the anode structure of each sub-pixel on the base substrate has a greater number of symmetry axis than the figure of the orthographic projection of the opening of the sub-pixel on the base substrate.

According to some exemplary embodiments, for at least some sub-pixels in the plurality of sub-pixels, the figure of the orthographic projection of the anode structure of each sub-pixel on the base substrate is non-proportionally enlarged with respect to the figure of the orthographic projection of the opening of the sub-pixel on the base substrate.

According to some exemplary embodiments, for at least some sub-pixels in the plurality of sub-pixels, a geometric center of the figure of the orthographic projection of the anode structure of each sub-pixel on the base substrate does not coincide with a geometric center of the figure of the orthographic projection of the opening of the sub-pixel on the base substrate.

According to some exemplary embodiments, for at least some sub-pixels in the plurality of sub-pixels, the geometric center of the figure of the orthographic projection of the anode structure of at least one sub-pixel on the base substrate is offset in the first arrangement direction with respect to the geometric center of the figure of the orthographic projection of the opening of the sub-pixel on the base substrate; and/or the geometric center of the figure of the orthographic projection of the anode structure of at least one sub-pixel on the base substrate is offset in the second arrangement direction with respect to the geometric center of the figure of the orthographic projection of the opening of the sub-pixel on the base substrate.

According to some exemplary embodiments, for at least some sub-pixels in the plurality of sub-pixels, the geometric center of the figure of the orthographic projection of the anode structure of at least one sub-pixel on the base substrate is offset in a first direction with respect to the geometric center of the figure of the orthographic projection of the opening of the sub-pixel on the base substrate, and the first direction is inclined with respect to each of the first arrangement direction and the second arrangement direction; and/or for at least some sub-pixels in the plurality of sub-pixels, the geometric center of the figure of the orthographic projection of the anode structure of at least one sub-pixel on the base substrate is offset in a second direction with respect to the geometric center of the figure of the orthographic projection of the opening of the sub-pixel on the base substrate, the second direction is inclined with respect to each of the first arrangement direction and the second arrangement direction, and an included angle is formed between the second direction and the first direction.

According to some exemplary embodiments, the figure of the orthographic projection of the opening of the sub-pixel on the base substrate has a first symmetry axis, a first vertex and a second vertex, the first vertex and the second vertex are located on the first symmetry axis, and the first vertex and the second vertex are arranged opposite to each other; the first symmetry axis and the figure of the orthographic projection of the anode structure of the sub-pixel on the base substrate have a first intersection point adjacent to the first vertex and a second intersection point adjacent to the second vertex; and in an extension direction of the first symmetry axis, a first distance between the first vertex and the first intersection point is not equal to a second distance between the second vertex and the second intersection point.

According to some exemplary embodiments, in a first cross-sectional view, the pixel definition layer on both sides of the opening of the sub-pixel covers parts of the anode structure of the sub-pixel respectively, a width of one part of the anode structure covered by the pixel definition layer on one side of the opening of the sub-pixel is not equal to a width of the other part of the anode structure covered by the pixel definition layer on the other side of the opening of the sub-pixel, a first cross section is perpendicular to a surface of the first electrode layer in contact with the pixel definition layer, and the first symmetry axis is located on the first cross section.

According to some exemplary embodiments, the plurality of sub-pixels include an $n^{th}$ row of sub-pixels and an $(n+2)^{th}$ row of sub-pixels, and the $n^{th}$ row of sub-pixels and the $(n+2)^{th}$ row of sub-pixels are arranged in the second arrangement direction; and the $n^{th}$ row of sub-pixels include a first sub-pixel, the $(n+2)^{th}$ row of sub-pixels include a second sub-pixel closest to the first sub-pixel in the first arrangement direction and having a same color as the first sub-pixel, a figure of an orthographic projection of the opening of the first sub-pixel on the base substrate is not in translational coincidence with a figure of an orthographic projection of the opening of the second sub-pixel on the base substrate, and a figure of an orthographic projection of the anode structure of the first sub-pixel on the base substrate is in translational coincidence with a figure of an orthographic projection of the anode structure of the second sub-pixel on the base substrate.

According to some exemplary embodiments, in the sub-pixels having a same color in the $n^{th}$ row of sub-pixels and the $(n+2)^{th}$ row of sub-pixels, the figure of the orthographic projection of the opening of at least part of the sub-pixels on the base substrate is not in translational coincidence with the figure of the orthographic projection of the opening of the other part of the sub-pixels on the base substrate, and the figures of the orthographic projections of the anode structures of the sub-pixels on the base substrate are in translational coincidence with each other.

According to some exemplary embodiments, the plurality of sub-pixels include an $m^{th}$ column of sub-pixels and an $(m+2)^{th}$ column of sub-pixels, and the $m^{th}$ column of sub-pixels and the $(m+2)^{th}$ column of sub-pixels are arranged in the first arrangement direction; and the $m^{th}$ column of sub-pixels include a third sub-pixel, the $(m+2)^{th}$ column of sub-pixels include a fourth sub-pixel closest to the third sub-pixel in the second arrangement direction and having a same color as the third sub-pixel, a figure of an orthographic projection of the opening of the third sub-pixel on the base substrate is not in translational coincidence with a figure of an orthographic projection of the opening of the fourth sub-pixel on the base substrate, and a figure of an orthographic projection of the anode structure of the third sub-pixel on the base substrate is in translational coincidence with a figure of an orthographic projection of the anode structure of the fourth sub-pixel on the base substrate.

According to some exemplary embodiments, in the sub-pixels having a same color in the $m^{th}$ column of sub-pixels and the $(m+2)^{th}$ column of sub-pixels, the figure of the orthographic projection of the opening of at least part of the sub-pixels on the base substrate is not in translational coincidence with the figure of the orthographic projection of the opening of the other part of the sub-pixels on the base substrate, and the figures of the orthographic projections of the anode structures of the sub-pixels on the base substrate are in translational coincidence with each other.

According to some exemplary embodiments, for at least one type of sub-pixels having a same color among the plurality of sub-pixels, an arrangement pitch of the figures of the orthographic projections of the openings of a plurality of sub-pixels having the same color on the base substrate in the first arrangement direction is a first arrangement pitch, an arrangement pitch of the figures of the orthographic projections of the anode structures of the plurality of sub-pixels having the same color on the base substrate in the first arrangement direction is a second arrangement pitch, and the first arrangement pitch is greater than the second arrangement pitch; and/or for at least one type of sub-pixels having a same color among the plurality of sub-pixels, an arrangement pitch of the figures of the orthographic projections of the openings of a plurality of sub-pixels having the same color on the base substrate in the second arrangement direction is a third arrangement pitch, an arrangement pitch of the figures of the orthographic projections of the anode structures of the plurality of sub-pixels having the same color on the base substrate in the second arrangement direction is a fourth arrangement pitch, and the third arrangement pitch is greater than the fourth arrangement pitch; and/or for at least one type of sub-pixels having a same color among the plurality of sub-pixels, an arrangement pitch of the figures of the orthographic projections of the openings of a plurality of sub-pixels having the same color on the base substrate in the first direction is a first pitch, an arrangement pitch of the figures of the orthographic projections of the anode structures of the plurality of sub-pixels having the same color on the base substrate in the first direction is a second pitch, and the first pitch is greater than the second pitch; and/or for at least one type of sub-pixels having a same color among the plurality of sub-pixels, an arrangement pitch of the figures of the orthographic projections of the openings of a plurality of sub-pixels having the same color on the base substrate in the second direction is a third pitch, an arrangement pitch of the figures of the orthographic projections of the anode structures of the plurality of sub-pixels having the same color on the base substrate in the second direction is a fourth pitch, and the third pitch is greater than the fourth pitch.

According to some exemplary embodiments, the first arrangement pitch is m times of the second arrangement pitch, and m is greater than or equal to 1.5; and/or the third arrangement pitch is n times of the fourth arrangement pitch, and n is greater than or equal to 1.5; and/or the first pitch is p times of the second pitch, and p is greater than or equal to 1.5; and/or the third pitch is q times of the fourth pitch, and q is greater than or equal to 1.5.

According to some exemplary embodiments, for at least some sub-pixels in the plurality of sub-pixels, the figure of the orthographic projection of the opening of each sub-pixel on the base substrate has a shape obtained by cutting off at least one vertex angle from a polygon; and the figure of the orthographic projection of the anode structure of the sub-pixel on the base substrate is the polygon or a circle.

According to some exemplary embodiments, the figure of the opening having the shape obtained by cutting off the at least one vertex angle from the polygon includes a plurality of corner portions, the plurality of corner portions include a first corner portion and a second corner portion, the first corner portion is formed by cutting off a vertex angle between two sides of the polygon, and the second corner portion is opposite to the first corner portion.

According to some exemplary embodiments, the figure of the opening having the shape obtained by cutting off the at least one vertex angle from the polygon has a first symmetry axis, a first vertex and a second vertex, the first vertex is a point where the first symmetry axis intersects the first corner portion, and the second vertex is a point where the first symmetry axis intersects the second corner portion; the first symmetry axis and the figure of the orthographic projection of the anode structure of the sub-pixel on the base substrate have a first intersection point adjacent to the first vertex and a second intersection point adjacent to the second vertex; and in an extension direction of the first symmetry axis, a first distance between the first vertex and the first intersection point is greater than a second distance between the second vertex and the second intersection point.

According to some exemplary embodiments, the opening having the first corner portion is configured to define a light emitting region of at least one type of color sub-pixel.

According to some exemplary embodiments, the openings having the first corner portion and configured to define the light emitting regions of sub-pixels having a same color include at least two types of openings, and in different types of openings, directions from a vertex of the first corner portion to a vertex of a corner portion opposite to the first corner portion are different from each other; and the figures of the orthographic projections of the anode structures respectively covering different types of openings on the base substrate are in translational coincidence with each other.

According to some exemplary embodiments, the at least two types of openings include a first type of opening, a second type of opening, a third type of opening, and a fourth type of opening; a direction from the first corner portion to the second corner portion in the first type of opening is opposite to a direction from the first corner portion to the second corner portion in the second type of opening, and a direction from the first corner portion to the second corner portion in the third type of opening is opposite to a direction from the first corner portion to the second corner portion in the fourth type of opening; and the figures of the orthographic projections of the anode structures respectively covering the first type of opening, the second type of opening, the third type of opening and the fourth type of opening on the base substrate are in translational coincidence with each other.

According to some exemplary embodiments, for the $n^{th}$ row of sub-pixels and the $(n+2)^{th}$ row of sub-pixels, in the $n^{th}$ row of sub-pixels, the first type of opening and the second type of opening are alternately arranged in the first arrangement direction; in the $(n+2)^{th}$ row of sub-pixels, the third type of opening and the fourth type of opening are alternately arranged in the first arrangement direction; and/or for the $m^{th}$ column of sub-pixels and the $(m+2)^{th}$ column of sub-pixels, in the $m^{th}$ column of sub-pixels, the first type of opening and the second type of opening are alternately arranged in the second arrangement direction; in the $(m+2)^{th}$ column of sub-pixels, the third type of opening and the fourth type of opening are alternately arranged in the second arrangement direction.

According to some exemplary embodiments, for at least one first type of opening, two second type of openings are adjacent to the first type of opening in the first arrangement direction, two second type of openings are adjacent to the first type of opening in the second arrangement direction, two third type of openings are adjacent to the first type of opening in the first direction, and two fourth type of openings are adjacent to the first type of opening in the second direction.

According to some exemplary embodiments, for at least some first color sub-pixels in the plurality of sub-pixels, the opening of each sub-pixel includes a body portion and an auxiliary portion, an orthographic projection of the body portion of the opening on the base substrate is a circle, and an orthographic projection of the auxiliary portion of the opening on the base substrate protrudes in the second direction with respect to the circle; and the anode structure covering the opening having the body portion and the auxiliary portion includes a body portion and two auxiliary portions, an orthographic projection of the body portion of the anode structure on the base substrate is a circle, and orthographic projections of the two auxiliary portions of the anode structure on the base substrate protrude oppositely in the second direction with respect to the circle.

According to some exemplary embodiments, the openings of the at least some first color sub-pixels include at least two types of openings, and in different types of openings, protruding directions of the auxiliary portion of the opening with respect to the body portion of the opening are different from each other, and the figures of the orthographic projections of the anode structures respectively covering different types of openings on the base substrate are in translational coincidence with each other.

According to some exemplary embodiments, the at least two types of openings include a first type of opening and a second type of opening; the protruding direction of the auxiliary portion with respect to the body portion in the first type of opening is opposite to the protruding direction of the auxiliary portion with respect to the body portion in the second type of opening; and the figures of the orthographic projections of the anode structures respectively covering the first type of opening and the second type of opening on the base substrate are in translational coincidence with each other.

According to some exemplary embodiments, for at least some third color sub-pixels in the plurality of sub-pixels, the opening of each sub-pixel includes a body portion and an auxiliary portion, an orthographic projection of the body portion of the opening on the base substrate is a circle, and an orthographic projection of the auxiliary portion of the opening on the base substrate protrudes in the first direction with respect to the circle; and the anode structure covering the opening having the body portion and the auxiliary portion includes a body portion and two auxiliary portions, an orthographic projection of the body portion of the anode structure on the base substrate is a circle, and orthographic projections of the two auxiliary portions of the anode structure on the base substrate protrude oppositely in the first direction with respect to the circle.

According to some exemplary embodiments, the openings of the at least some third color sub-pixels include at least two types of openings, and in different types of openings, protruding directions of the auxiliary portion of the opening with respect to the body portion of the opening are different from each other, and the figures of the orthographic projections of the anode structures respectively covering different types of openings on the base substrate are in translational coincidence with each other.

According to some exemplary embodiments, the at least two types of openings include a third type of opening and a fourth type of opening; the protruding direction of the auxiliary portion with respect to the body portion in the third type of opening is opposite to the protruding direction of the auxiliary portion with respect to the body portion in the fourth type of opening; and the figures of the orthographic projections of the anode structures respectively covering the third type of opening and the fourth type of opening on the base substrate are in translational coincidence with each other.

According to some exemplary embodiments, for the $n^{th}$ row of sub-pixels and the $(n+2)^{th}$ row of sub-pixels, the first color sub-pixels in the $n^{th}$ row of sub-pixels include the first type of openings, and the first color sub-pixels in the $(n+2)^{th}$ of sub-pixels include the second type of openings; and/or for the $m^{th}$ column of sub-pixels and the $(m+2)^{th}$ column of sub-pixels, the first color sub-pixels in the $m^{th}$ column of sub-pixels include the first type of openings, and the first color sub-pixels in the $(m+2)^{th}$ column of sub-pixels include the second type of openings; and/or in at least one row of first color sub-pixels arranged in the second direction, the first type of openings and the second type of openings are alternately arranged in the second direction.

According to some exemplary embodiments, for the $n^{th}$ row of sub-pixels and the $(n+2)^{th}$ row of sub-pixels, the third color sub-pixels in the $n^{th}$ row of sub-pixels include the third type of openings, and the third color sub-pixels in the $(n+2)^{th}$ of sub-pixels include the fourth type of opening; and/or for the $m^{th}$ column of sub-pixels and the $(m+2)^{th}$ column of sub-pixels, the third color sub-pixels in the $m^{th}$ column of sub-pixels include the third type of openings, and the third color sub-pixels in the $(m+2)^{th}$ column of sub-pixels include the fourth type of openings; and/or in at least one row of third color sub-pixels arranged in the first direction, the third type of openings and the fourth type of openings are alternately arranged in the first direction.

According to some exemplary embodiments, at least one of the figure of the orthographic projection of the first type of opening on the base substrate and the figure of the orthographic projection of the second type of opening on the base substrate is only symmetrical with respect to a first symmetry axis extending in the second direction; the figure of the orthographic projection of the anode structure covering the first type of opening on the base substrate is symmetrical with respect to the first symmetry axis extending in the second direction and a second symmetry axis extending in the first direction, and the figure of the orthographic projection of the anode structure covering the second type of opening on the base substrate is symmetrical with respect to the first symmetry axis extending in the second direction and the second symmetry axis extending in the first direction; and/or at least one of the figure of the orthographic projection of the third type of opening on the base substrate and the figure of the orthographic projection of the fourth type of opening on the base substrate is only symmetrical with respect to the second symmetry axis extending in the first direction; the figure of the orthographic projection of the anode structure covering the third type of opening on the base substrate is symmetrical with respect to the second symmetry axis extending in the first direction and the first symmetry axis extending in the second direction, and the figure of the orthographic projection of the anode structure covering the fourth type of opening on the base substrate is symmetrical with respect to the second symmetry axis extending in the first direction and the first symmetry axis extending in the second direction.

According to some exemplary embodiments, for at least some sub-pixels in the plurality of sub-pixels, the figure of the orthographic projection of the opening of each sub-pixel on the base substrate is a polygon, the polygon has a first vertex angle and a first side opposite to the first vertex angle; the figure of the orthographic projection of the anode structure of each sub-pixel on the base substrate is a rectangle.

According to some exemplary embodiments, the openings having the first vertex angle and configured to define the light emitting regions of sub-pixels having a same color include at least two types of openings, and in different types of openings, directions from a vertex of the first vertex angle to the first side opposite to the first vertex angle are different from each other; and the figures of the orthographic projections of the anode structures respectively covering different types of openings on the base substrate are in translational coincidence with each other.

According to some exemplary embodiments, for an $n^{th}$ row of sub-pixels and an $(n+1)^{th}$ row of sub-pixels, in the $n^{th}$ row of sub-pixels, one type of openings in at least two types of openings are arranged in the first arrangement direction; in the $(n+1)^{th}$ row of sub-pixels, another type of openings in the at least two types of openings are arranged in the first arrangement direction; and for the $n^{th}$ row of sub-pixels and an $(n+1)^{th}$ row of sub-pixels, the figures of the orthographic projections of the anode structures of two sub-pixels in a same column on the base substrate are in translational coincidence with each other.

According to some exemplary embodiments, for at least some sub-pixels in the plurality of sub-pixels, the opening of each sub-pixel includes two sub-openings in a mirror arrangement, and the orthographic projection of the anode structure of the sub-pixel on the base substrate covers the orthographic projections of the two sub-openings in the mirror arrangement on the base substrate; each of the orthographic projections of the two sub-openings on the base substrate is a polygon, and the polygon has a first vertex angle and a first side opposite to the first vertex angle.

According to some exemplary embodiments, the openings having the first vertex angle and configured to define the light emitting regions of sub-pixels having a same color include at least two types of openings, and in different types of openings, directions from a vertex of the first vertex angle to the first side opposite to the first vertex angle are different from each other; and the figures of the orthographic projections of the anode structures respectively covering different types of openings on the base substrate are in translational coincidence with each other.

According to some exemplary embodiments, for the $n^{th}$ row of sub-pixels and the $(n+2)^{th}$ row of sub-pixels, in the $n^{th}$ row of sub-pixels, one type of openings in at least two types of openings are arranged in the first arrangement direction; in the $(n+2)^{th}$ row of sub-pixels, another type of openings in the at least two types of openings are arranged in the first arrangement direction; and for the $n^{th}$ row of sub-pixels and the $(n+2)^{th}$ row of sub-pixels, the figures of the orthographic projections of the anode structures of two sub-pixels in a same column on the base substrate are in translational coincidence with each other.

In another aspect, a display device is provided, and the display device includes the display substrate described above.

BRIEF DESCRIPTION OF THE DRAWINGS

By describing in detail exemplary embodiments of the present disclosure with reference to the drawings, the features and advantages of the present disclosure will become more apparent.

DETAILED DESCRIPTION OF EMBODIMENTS

Figure 1A:
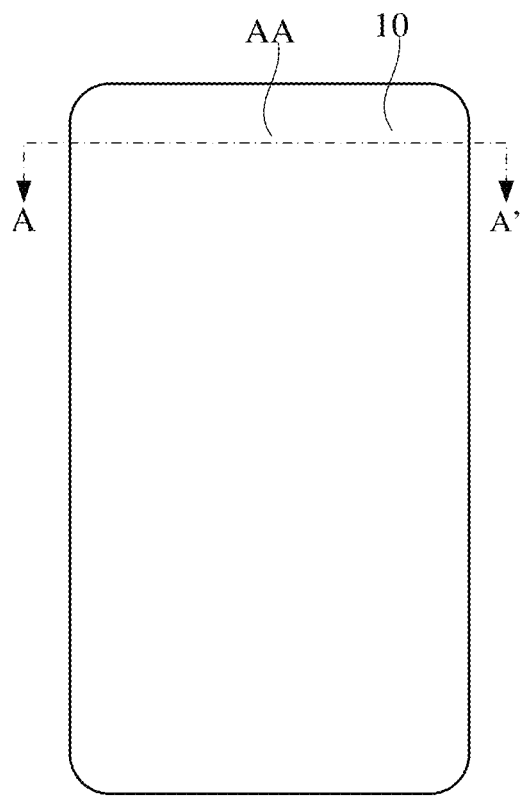
FIG. 1A shows a schematic plan view of a display device according to some exemplary embodiments of the present disclosure, in which a plan structure of a display substrate included in the display device is schematically shown.

In order to make objectives, technical solutions and advantages of the present disclosure more clear, the technical solutions of the embodiments of the present disclosure will be clearly and completely described below with reference to the accompanying drawings. Obviously, the described embodiments are merely some embodiments of the present disclosure, rather than all embodiments. Based on the described embodiments of the present disclosure, all additional embodiments obtained by those ordinary skilled in the art without carrying out inventive effort fall within the protection scope of the present disclosure.

It should be noted that in the accompanying drawings, for clarity and/or description purposes, a size and a relative size of an element may be enlarged. Accordingly, the size and the relative size of each element need not to be limited to those shown in the figures. In the specification and the accompanying drawings, the same or similar reference numerals represent the same or similar components.

When an element is described as being "on", "connected to" or "coupled to" another element, the element may be directly on the other element, directly connected to the other element, or directly coupled to the other element, or an intermediate element may be provided. However, when an element is described as being "directly on", "directly connected to" or "directly coupled to" another element, no intermediate element is provided. Other terms and/or expressions used to describe a relationship between elements, such as "between" and "directly between", "adjacent" and "directly adjacent", "on" and "directly on", and so on, should be interpreted in a similar manner. In addition, the term "connection" may refer to a physical connection, an electrical connection, a communication connection and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objectives of the present disclosure, "at least one of X, Y and Z" and "at least one selected from a group consisting of X, Y and Z" may be interpreted as only X, only Y, only Z, or any combination of two or more of X, Y and Z, such as XYZ, XY, YZ and XZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another one. Accordingly, for example, a first component, a first member, a first element, a first region, a first layer and/or a first part discussed below may be referred to as a second component, a second member, a second element, a second region, a second layer and/or a second part without departing from the teachings of the present disclosure.

For ease of description, terms of spatial relationships, such as "upper", "lower", "left", "right" and so on may be used herein to describe a relationship between one element or feature and another element or feature as shown in the figures. It should be understood that the terms of spatial relationships are intended to cover other different orientations of a device in use or in operation in addition to the orientations described in the figures. For example, if a device in the figures is turned upside down, an element or feature described as being "below" or "under" another element or feature will be oriented to be "above" or "on" the other element or feature.

Here, the expression "repetitive unit" may mean that at least two or more units are arranged in the display substrate and these units are repeated immediately. The repetitive unit may refer to a combination of a plurality of sub-pixels, for example, a combination of a plurality of sub-pixels used to display a pixel point. A plurality of "repetitive units" are repeatedly arranged in an array on a base substrate. For example, a repetitive unit may include at least one pixel, such as two, three, four or more sub-pixels. Here, for convenience of description, a repetitive unit located in a first display region is referred to as a first repetitive unit, and a repetitive unit located in a second display region is referred to as a second repetitive unit. Here, the expression "repetitive unit" may also be referred to as a "pixel structure".

Here, the expression "pixel density" refers to the number of the repetitive units or sub-pixels per unit area. Similarly, the expression "distribution density" refers to the number of components (such as repetitive units, sub-pixels, spacers, etc.) per unit area.

Here, unless otherwise specified, the expression "opening" refers to an opening in each sub-pixel of a pixel definition layer. The opening exposes at least part of an anode structure of a light emitting device of the sub-pixel, and at least part of a light emitting layer of the light emitting device is also located in the opening, that is, the opening corresponds to a light emitting region of the sub-pixel.

Here, unless otherwise specified, the expression "a center of an opening" refers to a geometric center or a centroid of an orthographic projection of the opening on the base substrate. For example, in a case that the opening is a circle, the center of the opening is a center of the circle; in a case that the opening is an ellipse, the center of the opening is a center of the ellipse, that is, an intersection point of a major axis and a minor axis of the ellipse; in a case that the opening is a rectangle, the center of the opening is a center of the rectangle, that is, an intersection point of two diagonal lines of the rectangle.

Here, unless otherwise specified, the expression "A and B are located substantially on a same straight line extending parallel to a first arrangement direction" includes the following cases. A and B are located on the same straight line extending parallel to the first arrangement direction; positions of A and B have a certain error in a direction perpendicular to the first arrangement direction, and the error is less than or equal to ±5 microns.

Here, unless otherwise specified, "a distance between a first opening and a second opening" and similar expressions refer to a distance between a center of the first opening and a center of the second opening, and "a separation distance between the first opening and the second opening" and similar expressions refer to a distance between an edge closest to the second opening of the first opening and an edge closest to the first opening of the second opening.

It should be understood that "translation of figure" refers to a figure movement for moving a figure by a distance in a certain direction on a plane. If a new figure obtained by a translation of an original figure may coincide with the original figure, only with a change in position, in other words, on a plane, if a figure may coincide with another figure only through a translational movement, it may be regarded that the two figures are in translational coincidence. Accordingly, on a plane, if a figure may not coincide with another figure only through a translational movement, it may be regarded that the two figures are not in translational coincidence.

"Rotation of figure" refers to a figure movement for rotating a figure by an angle around a fixed point in a certain direction on a plane. The fixed point is called a center of rotation, and the angle is called an angle of rotation. Rotation does not change a shape and a size of the figure. On a plane, if a figure may coincide with another figure through translation and rotation, it may be regarded that the two figures are not in translational coincidence, but in rotational coincidence.

Here, unless otherwise specified, "figures with different shapes" means that two figures have different shapes; if two figures have the same shape but different areas, they are not "figures with different shapes". For example, "figures with different shapes" may be two figures neither in translational coincidence nor in rotational coincidence.

Here, for convenience of description, directional expressions "first arrangement direction", "second arrangement direction", "first direction" and "second direction" are used, for example, "first arrangement direction X", "second arrangement direction Y", "first direction M1", "second direction M2". Exemplarily, the first arrangement direction X and the second arrangement direction Y may represent arrangement directions of sub-pixels, which may or may not be parallel to a direction of a connecting line between geometric centers of light emitting regions of two adjacent sub-pixels. For example, the first arrangement direction intersects the second arrangement direction. For example, an included angle between the first arrangement direction and the second arrangement direction may be 80 degrees to 100 degrees. For example, the included angle between the first arrangement direction and the second arrangement direction may be 85 degrees to 95 degrees. For example, the first arrangement direction may or may not be perpendicular to the second arrangement direction. In the embodiments of the present disclosure, the first arrangement direction and the second arrangement direction may be interchanged. The first direction M1 and the second direction M2 may represent directions intersecting the first arrangement direction X and the second arrangement direction Y. It should be understood that the first direction M1 and the second direction M2 may also represent the arrangement directions of the sub-pixels, which may or may not be parallel to a direction of a connecting line between geometric centers of light emitting regions of two adjacent sub-pixels. For example, the first direction intersects the second direction. For example, an included angle between the first direction and the second direction may be 80 degrees to 100 degrees. For example, the included angle between the first direction and the second direction may be 85 degrees to 95 degrees. For example, the first direction may or may not be perpendicular to the second direction. In the embodiments of the present disclosure, the first direction and the second direction may be interchanged. For example, in the embodiments of the present disclosure, the first arrangement direction X and the second arrangement direction Y may represent a row direction and a column direction respectively, which are perpendicular to each other; the first direction M1 and the second direction M2 are perpendicular to each other, and they form an included angle of about 45° with the first arrangement direction X and the second arrangement direction Y respectively.

The embodiments of the present disclosure provide a display substrate. The display substrate includes: a base substrate; a plurality of sub-pixels arranged on the base substrate in an array in a first arrangement direction and a second arrangement direction, wherein the plurality of sub-pixels include a plurality of light emitting regions; a first electrode layer located on the base substrate, wherein the first electrode layer includes a plurality of anode structures; and a pixel definition layer located on a side of the first electrode layer away from the base substrate, wherein the pixel definition layer includes a plurality of openings to define the plurality of light emitting regions. For at least some sub-pixels in the plurality of sub-pixels, an orthographic projection of the opening of each sub-pixel on the base substrate falls into an orthographic projection of the anode structure of the sub-pixel on the base substrate, and a figure of the orthographic projection of the opening of each sub-pixel on the base substrate has a different shape from a figure of the orthographic projection of the anode structure of the sub-pixel on the base substrate. The figure of the orthographic projection of the anode structure of each sub-pixel on the base substrate has a greater number of symmetry axis than the figure of the orthographic projection of the opening of the sub-pixel on the base substrate. In the embodiments of the present disclosure, for openings or light emitting regions having a special shape, the corresponding anode structures are designed to have a same shape to reduce an arrangement period (i.e., arrangement pitch) of the anode structures, so that interferometric fringes are invisible to human eyes, and a use experience of the display substrate may be significantly improved.

Figure 1B:
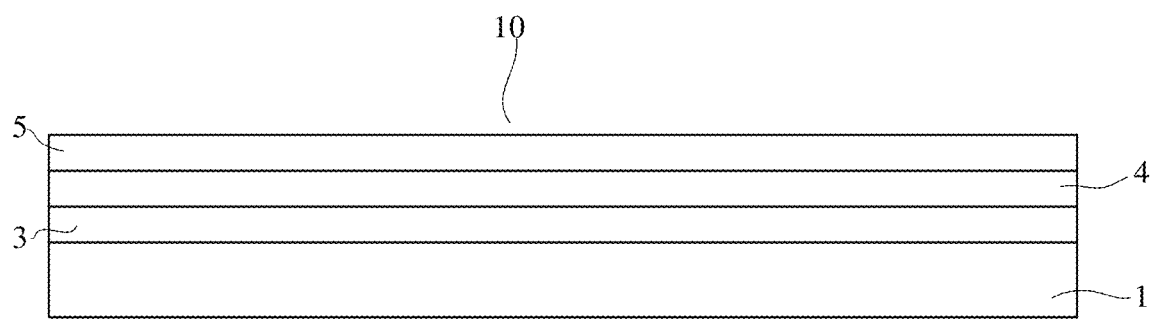
FIG. 1B shows a schematic cross-sectional view of the display device according to some exemplary embodiments of the present disclosure taken along line AA' in FIG. 1A.

FIG. 1A shows a schematic plan view of a display device according to some exemplary embodiments of the present disclosure, in which a plan structure of a display substrate included in the display device is schematically shown. FIG. 1B shows a schematic cross-sectional view of the display device according to some exemplary embodiments of the present disclosure taken along line AN in FIG. 1A.

As shown in FIG. 1A, a display device according to the embodiments of the present disclosure includes a display substrate 10. The display substrate 10 includes a display region, which may include a display region AA. For example, the display region AA may have a shape of circle, ellipse or rectangle, but the embodiments of the present disclosure are not limited thereto. For another example, the display region AA may have a shape of rectangle, rounded rectangle or have other suitable shapes.

As shown in FIG. 1B, the display substrate 10 may include a base substrate 1 and a plurality of pixel units arranged on the base substrate 1, and each pixel unit may include a plurality of sub-pixels.

An OLED display technology may be adopted in the display substrates shown in FIG. 1A to FIG. 1B. OLED display substrates are increasingly widely used in display products due to advantages of wide viewing angle, high contrast, fast response, low power consumption, foldability, flexibility and so on.

For example, the display substrate 10 may further include a driving circuit layer, a light emitting device layer and an encapsulation layer that are arranged on the base substrate 1. For example, a pixel driving circuit layer 3, a light emitting device layer 4 and an encapsulation layer 5 are schematically shown in FIG. 1B. The pixel driving circuit layer 3 includes a pixel driving circuit structure, and the light emitting device layer 4 includes a light emitting device such as an OLED. The pixel driving circuit structure may control a light emitting device of each sub-pixel to emit light, so as to achieve a display function. The pixel driving circuit structure may include a thin film transistor, a storage capacitor, and various signal lines. The various signal lines may include gate lines, data lines, ELVDD power lines, ELVSS power lines and so on, so as to provide various signals such as control signals, data signals and power supply voltages to the pixel driving circuit in each sub-pixel.

Figure 2A:
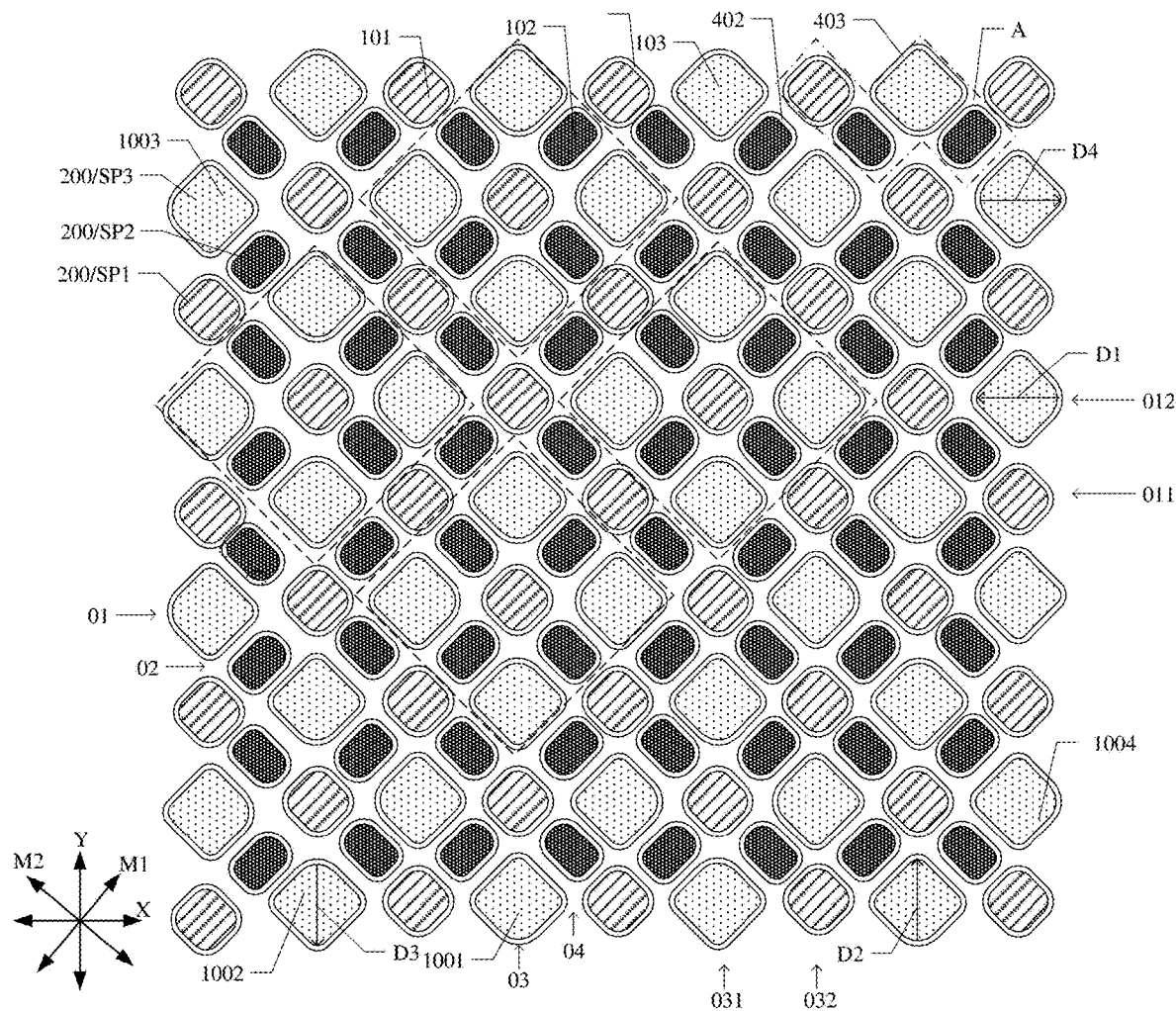
FIG. 2A schematically shows a partial schematic diagram of a sub-pixel arrangement in a display region of the display substrate according to some exemplary embodiments of the present disclosure.
Figure 2B:
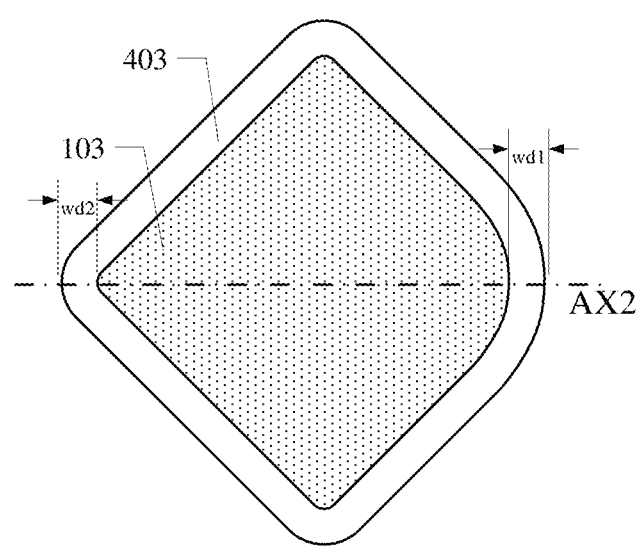
FIG. 2B shows an enlarged view of a single sub-pixel in FIG. 2A.
Figure 2C:
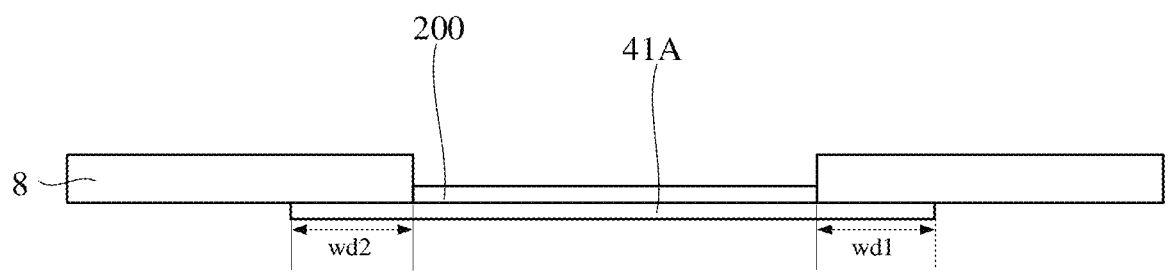
FIG. 2C shows a schematic cross-sectional view taken along line BB' in FIG. 2B.
Figure 3:
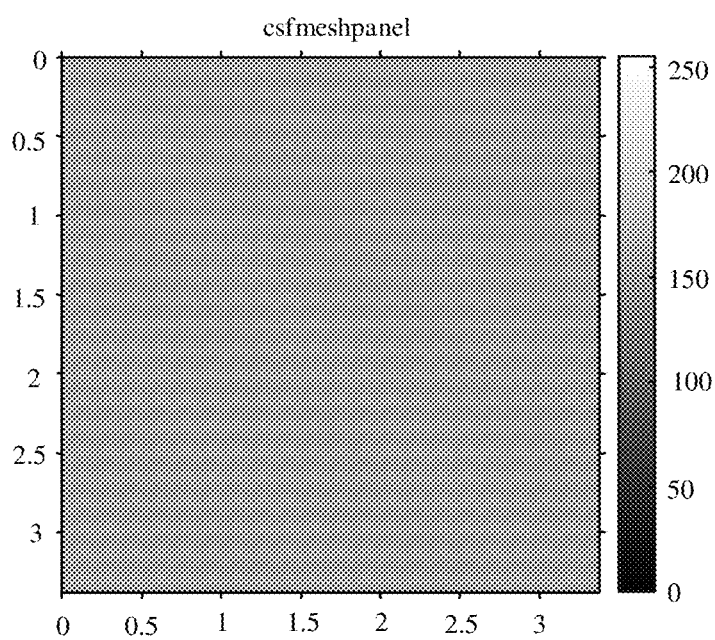
FIG. 3 schematically shows a simulation result of interferometric fringes in a case of the embodiments shown in FIG. 2A.

FIG. 2A schematically shows a partial schematic diagram of a sub-pixel arrangement in a display region of the display substrate according to some exemplary embodiments of the present disclosure. FIG. 2B shows an enlarged view of a single sub-pixel in FIG. 2A. FIG. 2C shows a schematic cross-sectional view taken along line BB' in FIG. 2B. FIG. 3 schematically shows a simulation result of interferometric fringes in a case of the embodiments shown in FIG. 2A.

As shown in FIG. 2A, the display substrate 10 includes a plurality of sub-pixels. For example, the plurality of sub-pixels include a plurality of first color sub-pixels SP1, a plurality of second color sub-pixels SP2, and a plurality of third color sub-pixels SP3. The plurality of first color sub-pixels SP1 and the plurality of third color sub-pixels SP3 are alternately arranged in a first arrangement direction (X-direction shown in FIG. 2A, also called row direction) to form a first pixel row 01, and the plurality of second color sub-pixels SP2 are arranged in the first arrangement direction X to form a second pixel row 02. The first pixel row 01 and the second pixel row 02 are alternately arranged in a second arrangement direction (Y-direction shown in FIG. 2A, also called column direction) intersecting the first arrangement direction X and are staggered with each other in the first arrangement direction X. For example, adjacent first color sub-pixel SP1 and second color sub-pixel SP2 are arranged in a first direction M1, and the first direction M1 intersects the first arrangement direction X and the second arrangement direction Y. As shown in FIG. 2A, the plurality of first color sub-pixels SP1 and the plurality of third color sub-pixels SP3 are alternately arranged in the second arrangement direction Y to form a plurality of first pixel columns 03, and the plurality of second color sub-pixels SP2 are arrayed in the first arrangement direction X and the second arrangement direction Y to form a plurality of second pixel rows 02 and a plurality of second pixel columns 04. The plurality of first pixel columns 03 and the plurality of second pixel columns 04 are alternately arranged in the first arrangement direction X and staggered with each other in the second arrangement direction Y, that is, a second pixel row 02 where a second color sub-pixel SP2 is located is located between two adjacent first pixel rows 01, and a second pixel column 04 where that second color sub-pixel SP2 is located is located between two adjacent first pixel columns 03.

As shown in FIG. 2A, the display substrate includes a plurality of repetitive units A arranged in an array. Each repetitive unit A includes two rows and four columns of sub-pixels, that is, each repetitive unit A includes one first color sub-pixel SP1, one third color sub-pixel SP3 and two second color sub-pixels SP2. The first color sub-pixel SP1 and the third color sub-pixel SP3 are common sub-pixels, and the four sub-pixels may achieve a display of two dummy pixel units through a dummy algorithm. For example, in a row of repetitive units, the first color sub-pixel SP1 in a second repetitive unit, the third color sub-pixel SP3 in a first repetitive unit and the second color sub-pixel SP2 close to the second repetitive unit in the first repetitive unit form a dummy pixel unit. At the same time, the first color sub-pixel SP1 in the second repetitive unit further forms a dummy pixel unit with the third color sub-pixel SP3 in the second repetitive unit and the second color sub-pixel SP2 close to the first repetitive unit in the second repetitive unit. In addition, the third color sub-pixel SP3 in the second repetitive unit further forms a dummy pixel unit with the other second color sub-pixel SP2 in the second repetitive unit and the first color sub-pixel SP1 in a third repetitive unit. In this way, a resolution of the display substrate may be effectively improved.

The sub-pixel in the embodiments of the present disclosure refers to a light emitting device structure. The first color sub-pixel, the second color sub-pixel and the third color sub-pixel are sub-pixels that emit light having different colors. The embodiments of the present disclosure are described with an example that the first color sub-pixel is a red sub-pixel, the second color sub-pixel is a green sub-pixel, and the third color sub-pixel is a blue sub-pixel. However, the example that the first color sub-pixel is a red sub-pixel, the second color sub-pixel is a green sub-pixel and the third color sub-pixel is a blue sub-pixel does not constitute a limitation to the protection scope of the embodiments of the present disclosure.

For example, the first color sub-pixel SP1 and the third color sub-pixel SP3 are common sub-pixels. According to luminescent spectra of the two, areas of the light emitting regions of the two are both greater than an area of the second color sub-pixel SP2.

For example, an area of the light emitting region of at least one blue sub-pixel is greater than an area of the light emitting region of at least one red sub-pixel, and the area of the light emitting region of at least one red sub-pixel is greater than an area of the light emitting region of at least one green sub-pixel, so as to prolong a service life of the display substrate. For example, the light emitting regions of sub-pixels having a same color have substantially the same area.

It should be noted that in FIG. 2A and similar figures below, an innermost figure represents an opening or a light emitting region of a sub-pixel, and an outline which has a larger area than the figure of the opening or light emitting region of the sub-pixel and which substantially surrounds the opening is an outline of the anode structure of the sub-pixel.

As shown in FIG. 2A, each sub-pixel includes a light emitting region 200. For example, the display substrate 10 includes a pixel definition layer 8 arranged on the base substrate 1 (referring to FIG. 12). A shape of the light emitting region 200 of each sub-pixel is defined by an opening in the pixel definition layer 8, and then the shape of the light emitting region 200 of each sub-pixel is substantially the same as a shape of the opening of the pixel definition layer 8.

Figure 12:
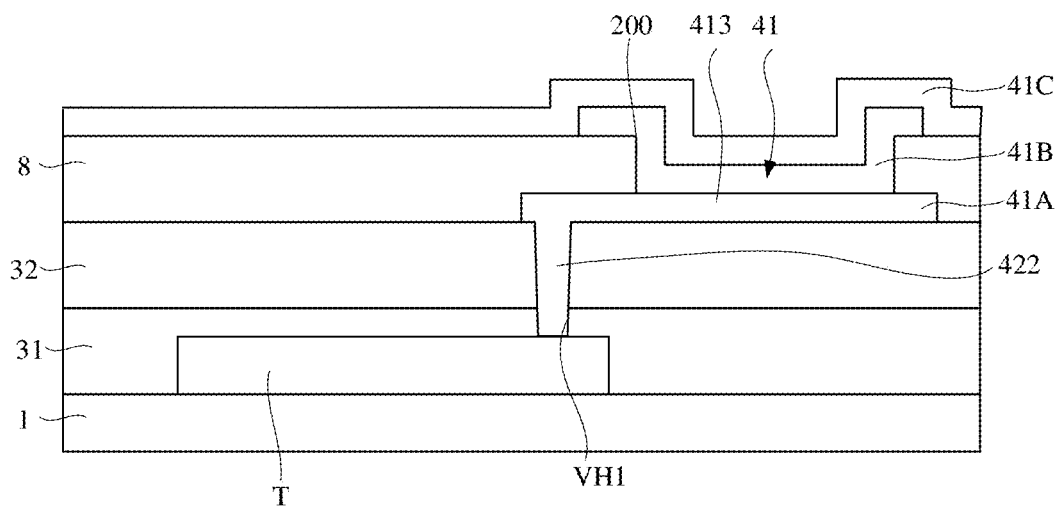
FIG. 12 shows a schematic cross-sectional view taken along line AA' in FIG. 1, in which a specific structure of the display substrate according to some exemplary embodiments of the present disclosure is schematically shown.

For example, with reference to FIG. 2A and FIG. 12, the pixel definition layer 8 includes a plurality of first openings 101, a plurality of second openings 102, and a plurality of third openings 103. The first opening 101 defines a first light emitting region of the first color sub-pixel SP1, the second opening 102 defines a second light emitting region of the second color sub-pixel SP2, and the third opening 103 defines a third light emitting region of the third color sub-pixel SP3.

For example, the display substrate includes a base substrate, and each sub-pixel and the pixel definition layer 8 are arranged on the base substrate. Each sub-pixel includes an organic light emitting element, which includes a first electrode, a light emitting layer and a second electrode arranged in a stack. The first electrode is located on a side of the light emitting layer facing the base substrate. For example, at least part of the first electrode is located on a side of the pixel definition layer facing the base substrate. When the light emitting layer is formed in the opening of the pixel definition layer 8, the first electrode and the second electrode on both sides of the light emitting layer may drive the light emitting layer in the opening of the pixel definition layer 8 to emit light. For example, a functional layer is provided between the light emitting layer and the first electrode, and/or between the light emitting layer and the second electrode. For example, the functional layer includes any one or more layers selected from a hole injection layer, a hole transport layer, an electron transport layer, a hole barrier layer, an electron barrier layer, an electron injection layer, an auxiliary light emitting layer, an interface improvement layer, or an antireflection layer.

For example, with reference to FIG. 2A and FIG. 12, the display substrate 10 includes a first electrode layer 41 located on the base substrate 1, and the first electrode layer 41 includes a plurality of anode structures. The anode structure constitutes a body portion of the anode of the organic light emitting element. For convenience of description, the anode structure included in the organic light emitting element of the first color sub-pixel SP1 may be referred to as a first anode structure 401, the anode structure included in the organic light emitting element of the second color sub-pixel SP2 may be referred to as a second anode structure 402, and the anode structure included in the organic light emitting element of the third color sub-pixel SP3 may be referred to as a third anode structure 403.

For example, an orthographic projection of the opening of the pixel definition layer on the base substrate is located within an orthographic projection of the corresponding light emitting layer on the base substrate, that is, the light emitting layer covers the opening of the pixel definition layer. An orthographic projection of the opening of each sub-pixel on the base substrate falls into the orthographic projection of the corresponding anode structure on the base substrate. For example, the orthographic projection of the first opening 101 of the first color sub-pixel SP1 on the base substrate 1 falls into the orthographic projection of the first anode structure 401 of the first color sub-pixel SP1 on the base substrate 1, the orthographic projection of the second opening 102 of the second color sub-pixel SP2 on the base substrate 1 falls into the orthographic projection of the second anode structure 402 of the second color sub-pixel SP2 on the base substrate 1, and the orthographic projection of the third opening 103 of the third color sub-pixel SP3 on the base substrate 1 falls into the orthographic projection of the third anode structure 403 of the third color sub-pixel SP3 on the base substrate 1. In the embodiments of the present disclosure, the anode structure has a larger area than the opening, which may help to ensure that an organic luminescent material in the opening of the sub-pixel emits light uniformly.

With reference to FIG. 2A to FIG. 2C, the orthographic projection of the anode structure of each sub-pixel on the base substrate and the orthographic projection of the corresponding opening on the base substrate have the same shape but different areas.

In the embodiments shown in FIG. 2A, it is schematically shown that the shape of the opening of each sub-pixel is a figure including rounded corners, then the shape of the light emitting region of each sub-pixel is also a figure including rounded corners, and for example, the shape of the anode structure of each sub-pixel may also be a figure including rounded corners. The figure of the opening of the pixel definition layer may include four straight sides, at least two adjacent straight sides are connected by a curve segment, and the curve segment forms a rounded corner. However, the embodiments of the present disclosure are not limited thereto. The figure of the light emitting region of each sub-pixel may also include three straight sides, five straight sides or six straight sides. Then, the number of vertex angles included in the light emitting region may change accordingly.

For example, in the embodiments shown in FIG. 2A, the orthographic projection of the first opening 101 of the first color sub-pixel SP1 on the base substrate 1 has a shape of rounded rectangle. Accordingly, the orthographic projection of the first anode structure 401 of the first color sub-pixel SP1 on the base substrate 1 also has the shape of rounded rectangle. The orthographic projection of the second opening 102 of the second color sub-pixel SP2 on the base substrate 1 has a shape of rounded rectangle. Accordingly, the orthographic projection of the second anode structure 402 of the second color sub-pixel SP2 on the base substrate 1 also has the shape of rounded rectangle. The orthographic projection of the third opening 103 of the third color sub-pixel SP3 on the base substrate 1 has an irregular shape (for example, obtained by cutting off a vertex angle from a rectangle). Accordingly, the orthographic projection of the third anode structure 403 of the third color sub-pixel SP3 on the base substrate 1 also has the irregular shape (for example, obtained by cutting off a vertex angle from a rectangle).

For example, the anode structure of each sub-pixel is proportionally enlarged with respect to the corresponding opening. Referring to FIG. 2C, on opposite sides of an opening of a sub-pixel, the anode structure of the sub-pixel exceeds an outline edge of the opening by equal widths, for example, wd1=wd2.

In the embodiments of the present disclosure, the orthographic projection of the third opening 103 of the third color sub-pixel SP3 on the base substrate 1 and the orthographic projection of the third anode structure 403 of the third color sub-pixel SP3 on the base substrate 1 have a shape of irregular polygon. For example, referring to FIG. 5, at least one first vertex angle 301 may be cut off from the irregular polygon to form at least one first corner portion 1011. The irregular polygon may further include a second corner portion 1012 opposite to the first corner portion 1011.

Referring to FIG. 2A, the third color sub-pixels SP3 may include at least two types of sub-pixels. In one type of sub-pixel, a direction from a vertex of the first corner portion 1011 to a vertex of the second corner portion 1012 opposite to the first corner portion 1011 is denoted by D1. In another type of sub-pixel, a direction from the vertex of the first corner portion 1011 to the vertex of the second corner portion 1012 opposite to the first corner portion 1011 is denoted by D4. The two directions are different.

For example, as shown in FIG. 2A, the direction D1 and the direction D4 may be parallel and opposite to each other, but the present disclosure is not limited thereto. The two directions may also intersect.

For example, as shown in FIG. 2A, the third color sub-pixels SP3 includes two different types of sub-pixels. The first corner portion 1011 of one type of sub-pixel faces rightward, and the first corner portion 1011 of the other type of sub-pixel faces leftward.

The embodiments of the present disclosure are not limited to this. For example, the first corner portions of two different types of sub-pixels in the third color sub-pixels may also respectively face upward and downward, or upward and leftward, or upward and rightward, or downward and rightward, or downward and leftward.

Certainly, the embodiments of the present disclosure are not limited to that the third color sub-pixels include two different types of sub-pixels. At least one of the first color sub-pixels and the second color sub-pixels may include two different types of sub-pixels, and a determination criterion for different types of sub-pixels among the sub-pixels having the same color may refer to the above-mentioned determination criterion for different types of sub-pixels among the third color sub-pixels.

For example, among the sub-pixels having the same color and including different types of sub-pixels, two sub-pixels adjacent in at least one of the first arrangement direction and the second arrangement direction are different types of sub-pixels.

For example, as shown in FIG. 2A, the first corner portions 1011 in two adjacent third color sub-pixels SP3 arranged in the first arrangement direction face different directions, for example, leftward and rightward respectively, but not limited to this, and may also face upward and downward, or upward and leftward, or upward and rightward, or downward and rightward, or downward and leftward.

For example, as shown in FIG. 2A, the first corner portions 1011 in two adjacent third color sub-pixels SP3 arranged in the second arrangement direction face different directions, for example, upward and downward, but not limited to this, and may also face leftward and rightward, or upward and leftward, or upward and rightward, or downward and rightward, or downward and leftward.

The embodiments of the present disclosure are not limited to this. The above-mentioned sub-pixels having at least one color may also include three types of sub-pixels. The first corner portions of the three different types of sub-pixels may face any three directions selected from upward, downward, leftward and rightward. The sub-pixels in the same row (or same column) may include the same type of sub-pixels, and may also include at least two types of sub-pixels. Two sub-pixels adjacent in at least one of the first arrangement direction and the second arrangement direction may be the same type of sub-pixels or different types of sub-pixels, which may be set according to actual product requirements. For example, one type of color sub-pixels may include the above-mentioned three types of sub-pixels, each type of color sub-pixels in two types of color sub-pixels may include the above-mentioned three types of sub-pixels, or each type of color sub-pixels in three types of color sub-pixels may include the above-mentioned three types of sub-pixels, which is not limited by the embodiments of the present disclosure.

For example, as shown in FIG. 2A, the above-mentioned at least one type of color sub-pixels include four different types of sub-pixels, including a first type of sub-pixel 1001, a second type of sub-pixel 1002, a third type of sub-pixel 1003, and a fourth type of sub-pixel 1004. In different types of sub-pixels, the directions from the vertex of the first corner portion 1011 to the vertex of the second corner portion 1012 are different from each other. For example, the first corner portions 1011 in different types of sub-pixels are in different positions. For example, the first corner portions 1011 in different types of sub-pixels face different directions.

For example, each type of sub-pixels may have the same shape or same area. For example, each type of sub-pixel may have the same shape and same area. For example, the quantities of different types of sub-pixels are substantially the same. For example, for the first type of sub-pixels 1001, the second type of sub-pixels 1002, the third type of sub-pixels 1003 and the fourth type of sub-pixels 1004, a quantity ratio of any two types of sub-pixels is in a range of 0.8 to 1.2. For example, the quantity ratio of the first type of sub-pixels 1001 to the second type of sub-pixels 1002 is in a range of 0.8 to 1.2, and the quantity ratio of the third type of sub-pixels 1003 to the fourth type of sub-pixels 1004 is in a range of 0.8 to 1.2. For example, for the first type of sub-pixels 1001, the second type of sub-pixels 1002, the third type of sub-pixels 1003 and the fourth type of sub-pixels 1004, the quantity ratio of any two types of sub-pixels is in a range of 0.9 to 1.1.

For example, as shown in FIG. 2A, in the first type of sub-pixel 1001, the second type of sub-pixel 1002, the third type of sub-pixel 1003 and the fourth type of sub-pixel 1004, the directions from the vertex of the first corner portion 1011 to the vertex of the second corner portion 1012 are direction D2, direction D3, direction D4 and direction D1 respectively. For example, in the opening of the first type of sub-pixel 1001, the direction from the vertex of the first corner portion 1011 to the vertex of the second corner portion 1012 is the direction D2; in the opening of the second type of sub-pixel 1002, the direction from the vertex of the first corner portion 1011 to the vertex of the second corner portion 1012 is the direction D3; in the opening of the third type of sub-pixel 1003, the direction from the vertex of the first corner portion 1011 to the vertex of the second corner portion 1012 is the direction D4; in the opening of the fourth type of sub-pixel 1004, the direction from the vertex of the first corner portion 1011 to the vertex of the second corner portion 1012 is the direction D1.

For example, as shown in FIG. 2A, in the first type of sub-pixel 1001 and the second type of sub-pixel 1002, the directions from the vertex of the first corner portion 1011 to the vertex of the second corner portion 1012 opposite to the first corner portion are opposite to each other and, for example, parallel to the second arrangement direction Y; in the third type of sub-pixel 1003 and the fourth type of sub-pixel 1004, the directions from the vertex of the first corner portion 1011 to the vertex of the second corner portion 1012 opposite to the first corner portion are opposite to each other and, for example, parallel to the first arrangement direction X. Therefore, the direction D2 is opposite to the direction D3, and the direction D4 is opposite to the direction D1.

The embodiments of the present disclosure schematically show that the third color sub-pixels include four different types of sub-pixels, but the present disclosure is not limited thereto. At least one type of color sub-pixels in the first color sub-pixels and the second color sub-pixels may include the above-mentioned four different types of sub-pixels, and in different types of sub-pixels among the other types of color sub-pixels, the directions from the vertex of the first corner portion to the vertex of the second corner portion may be parallel to the first arrangement direction or the second arrangement direction, or may intersect the first arrangement direction or the second arrangement direction.

In the display substrate provided by the embodiments of the present disclosure, by providing four different types of sub-pixels, a color deviation problem during a display of the display substrate may be improved. In addition, in a conventional display substrate, four corner portions included in opening regions of sub-pixels having different colors have the same shape. Different from such display substrate, the display substrate provided by the embodiments of the present disclosure may reduce the graininess during the display of the display substrate by providing the above-mentioned four different types of sub-pixels.

In the embodiments shown in FIG. 2A, the anode structure of each sub-pixel is proportionally enlarged with respect to the corresponding opening. That is, in the first type of sub-pixel 1001, the second type of sub-pixel 1002, the third type of sub-pixel 1003 and the fourth type of sub-pixel 1004, in terms of the anode structures of the sub-pixels, the directions from the vertex of the first corner portion 1011 to the vertex of the second corner portion 1012 are respectively direction D2, direction D3, direction D4 and direction D1. For example, in the opening of the first type of sub-pixel 1001, the direction from the vertex of the first corner portion 1011 to the vertex of the second corner portion 1012 is the direction D2; in the opening of the second type of sub-pixel 1002, the direction from the vertex of the first corner portion 1011 to the vertex of the second corner portion 1012 is the direction D3; in the opening of the third type of sub-pixel 1003, the direction from the vertex of the first corner portion 1011 to the vertex of the second corner portion 1012 is the direction D4; in the opening of the fourth type of sub-pixel 1004, the direction from the vertex of the first corner portion 1011 to the vertex of the second corner portion 1012 is the direction D1. Accordingly, the anode structures of the sub-pixels form a periodic arrangement of irregular figures. The inventors found through researches that when the anode structures of the sub-pixels form a periodic arrangement of irregular figures, light diffraction and light reflection in different rows and/or columns may have different paths, and periodic fringes may appear (referring to FIG. 3, in which interferometric fringes in a case of the embodiments shown in FIG. 2A are schematically shown), which greatly affects the use experience of users.

Figure 4A:
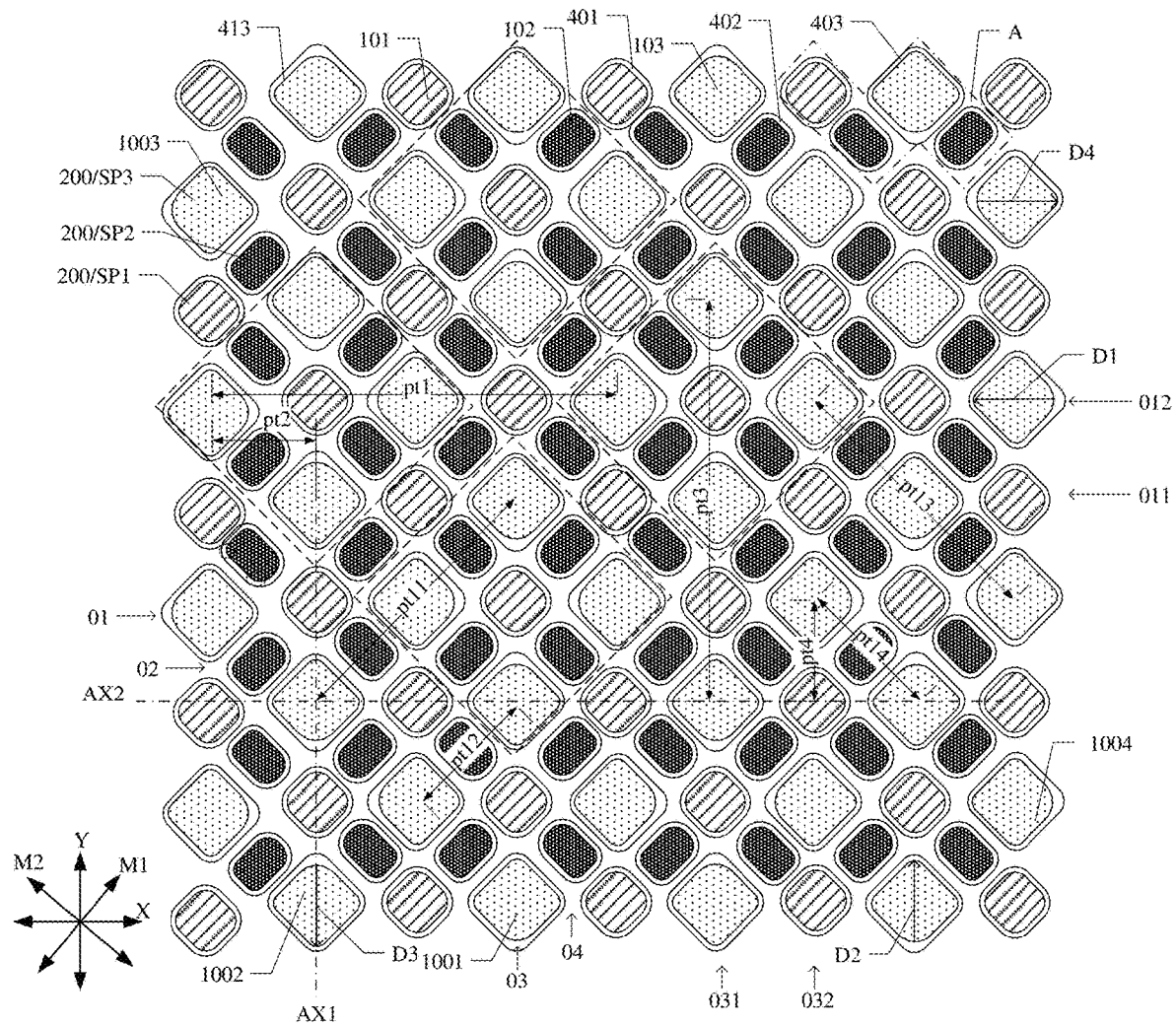
FIG. 4A schematically shows a partial schematic diagram of a sub-pixel arrangement in a display region of the display substrate according to some exemplary embodiments of the present disclosure.
Figure 4B:
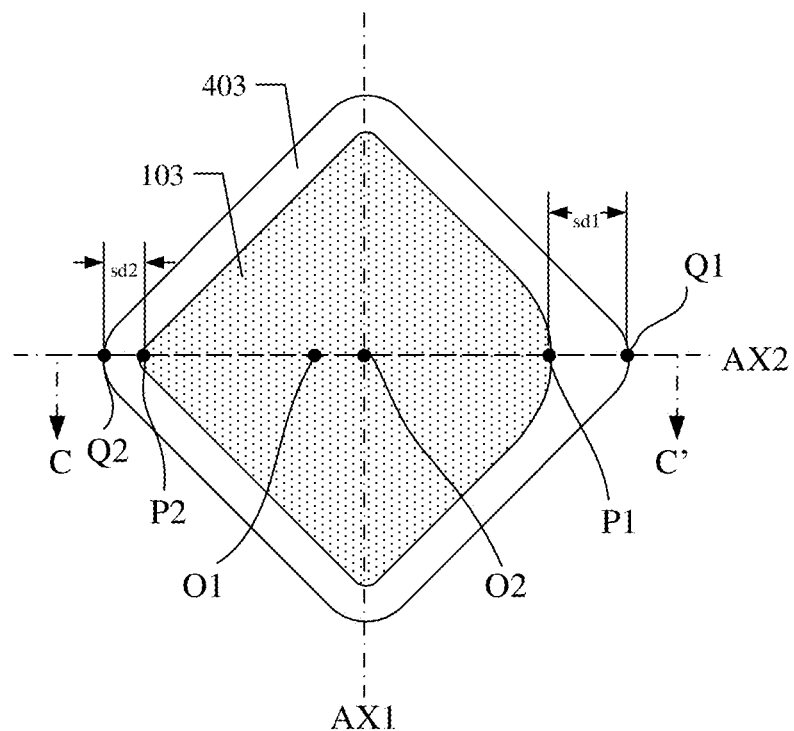
FIG. 4B shows an enlarged view of a single sub-pixel in FIG. 4A.
Figure 4C:
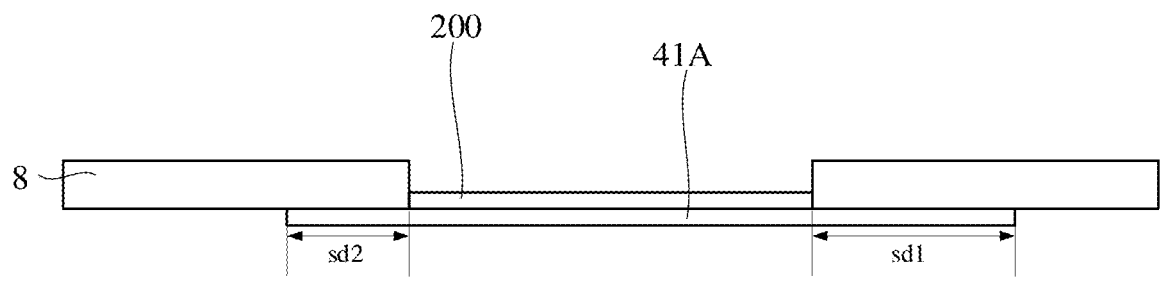
FIG. 4C shows a schematic cross-sectional view taken along line CC' in FIG. 4B.
Figure 5:
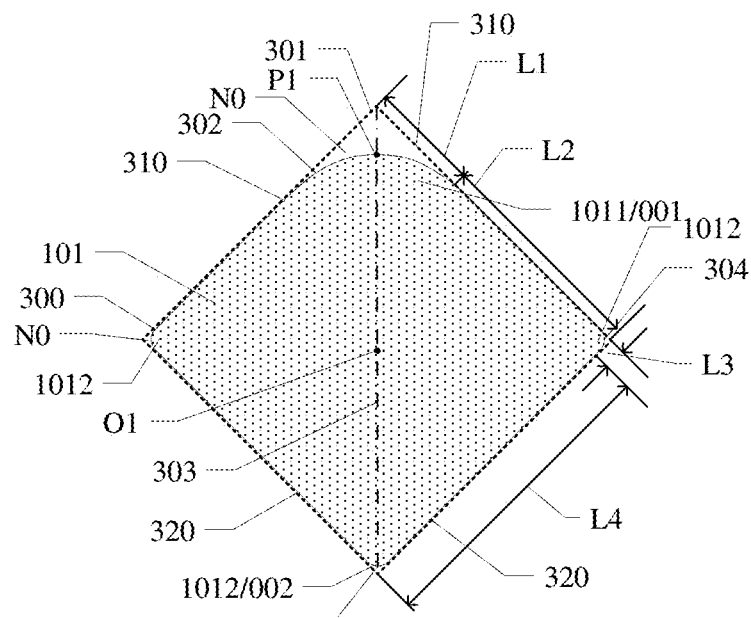
FIG. 5 shows an enlarged view of an opening of the single sub-pixel shown in FIG. 4A.
Figure 6:
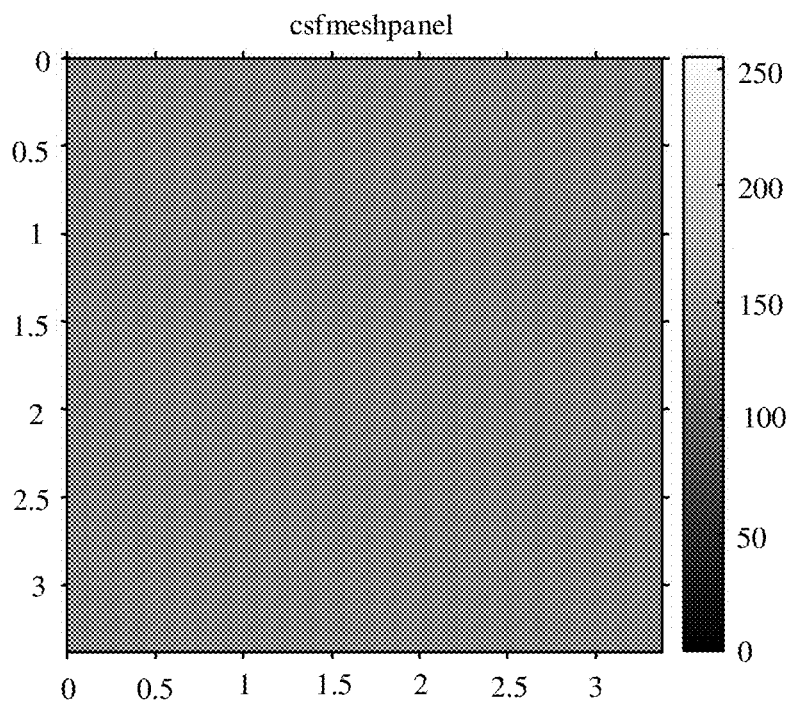
FIG. 6 schematically shows a simulation result of interferometric fringes in a case of the embodiments shown in FIG. 4A.
Figure 7:
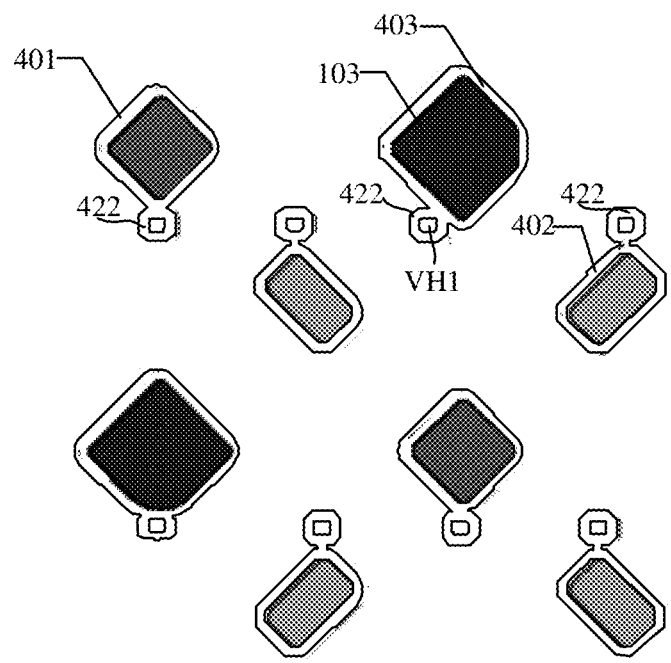
FIG. 7 schematically shows a partial schematic diagram of a specific structure of an anode of the display substrate according to some exemplary embodiments of the present disclosure.
Figure 8A:
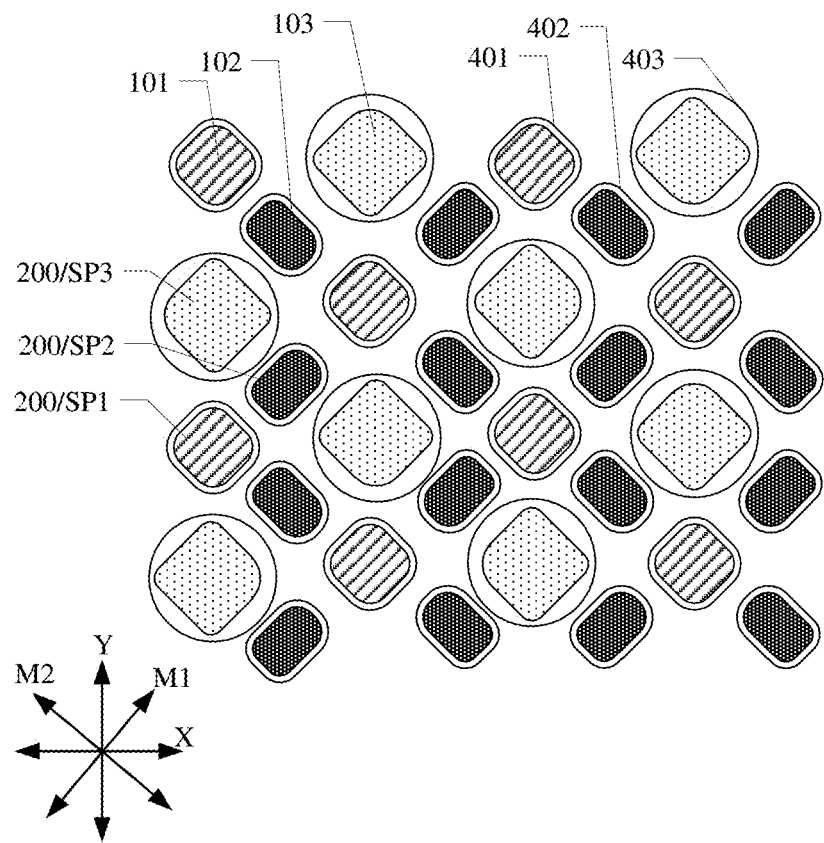
FIG. 8A schematically shows a partial schematic diagram of a sub-pixel arrangement in the display region of the display substrate according to other exemplary embodiments of the present disclosure.
Figure 8B:
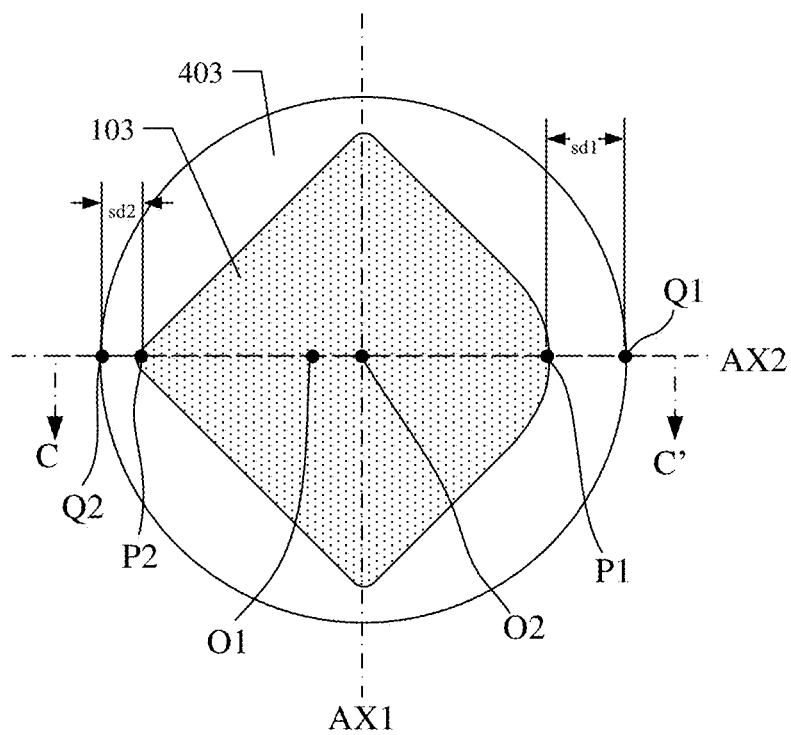
FIG. 8B to FIG. 8D respectively show enlarged views of a single sub-pixel in the display region of the display substrate according to other exemplary embodiments of the present disclosure.
Figure 8C:
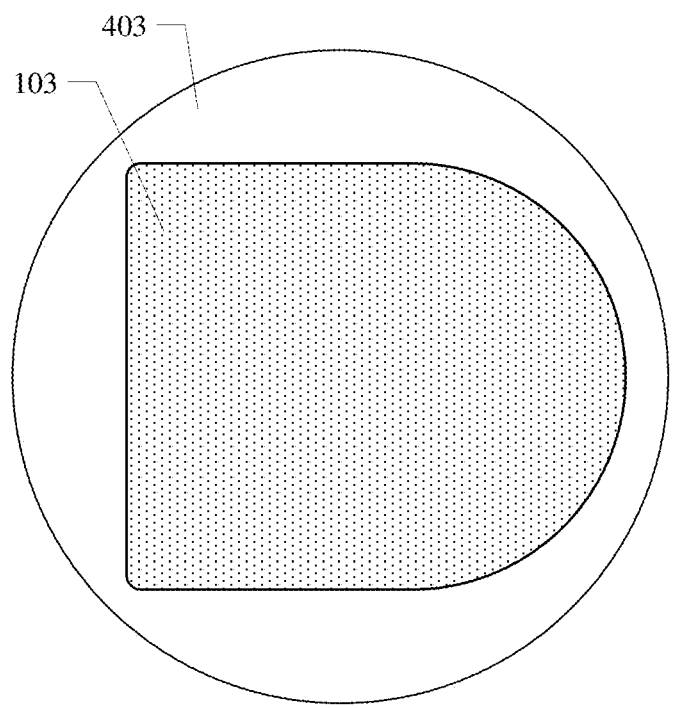
Figure 8D:
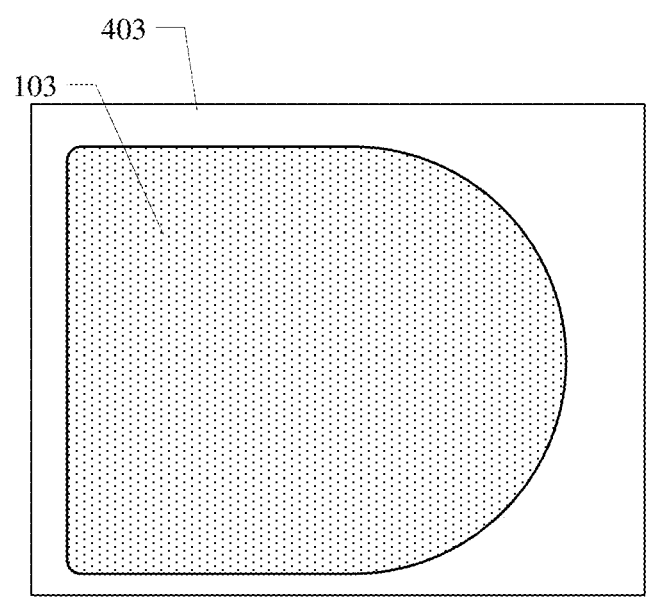
Figure 9A:
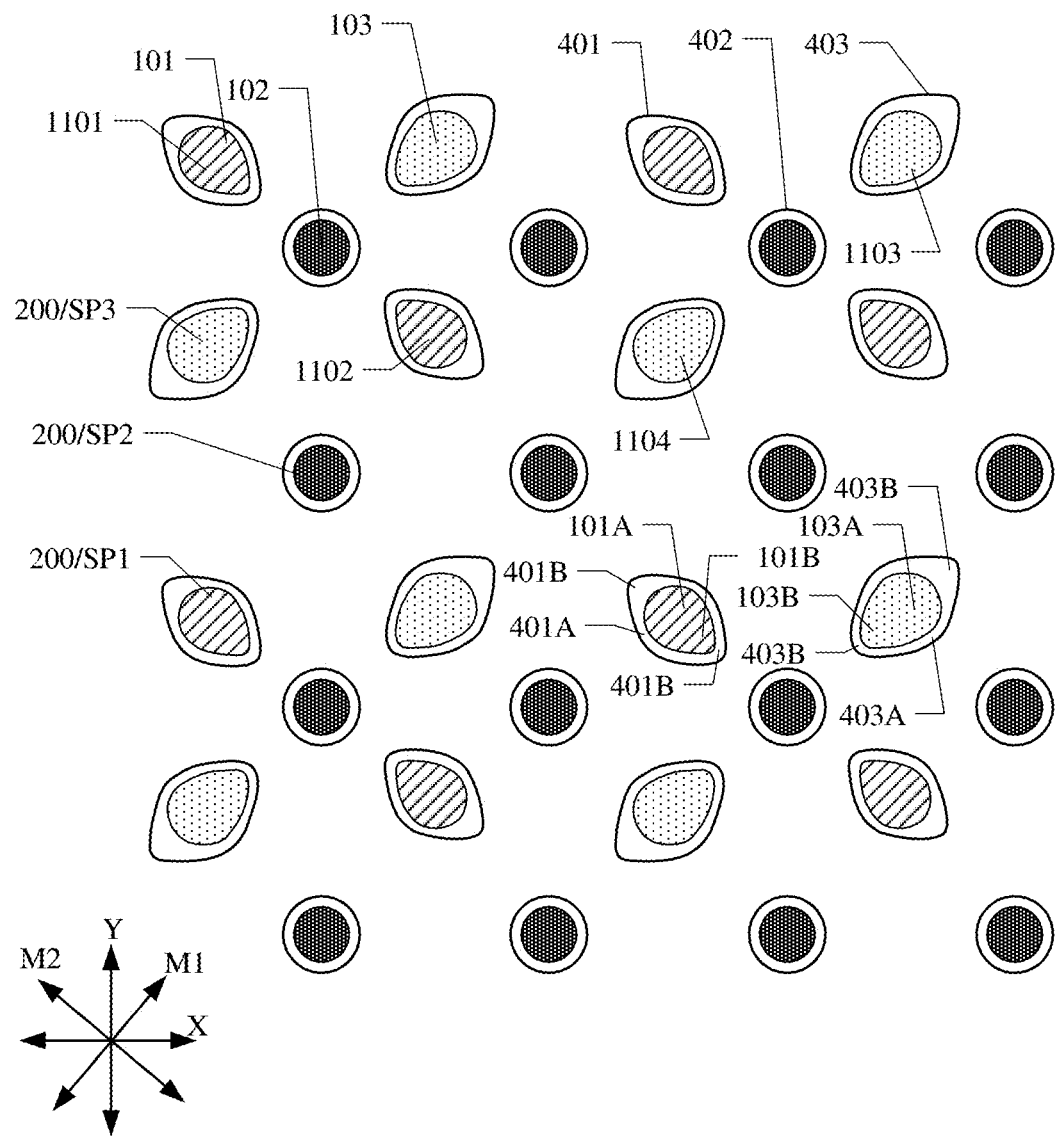
FIG. 9A schematically shows a partial schematic diagram of a sub-pixel arrangement in the display region of the display substrate according to other exemplary embodiments of the present disclosure.
Figure 9B:
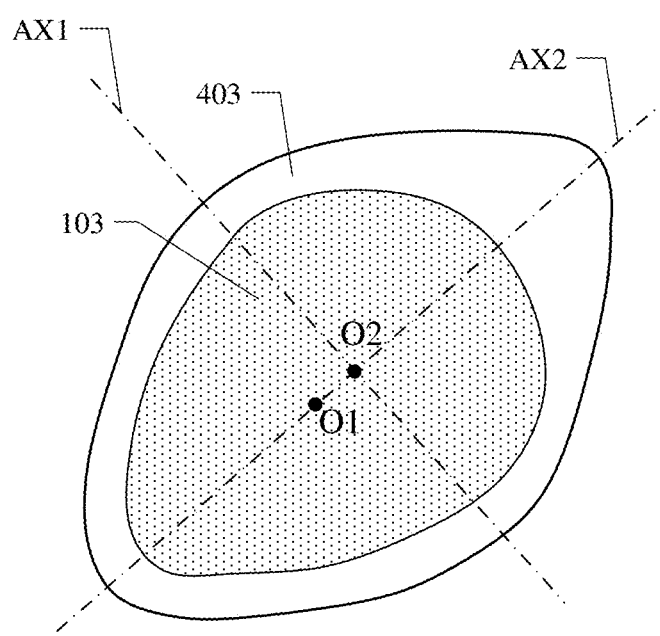
FIG. 9B shows an enlarged view of the single sub-pixel in FIG. 9A.
Figure 10A:
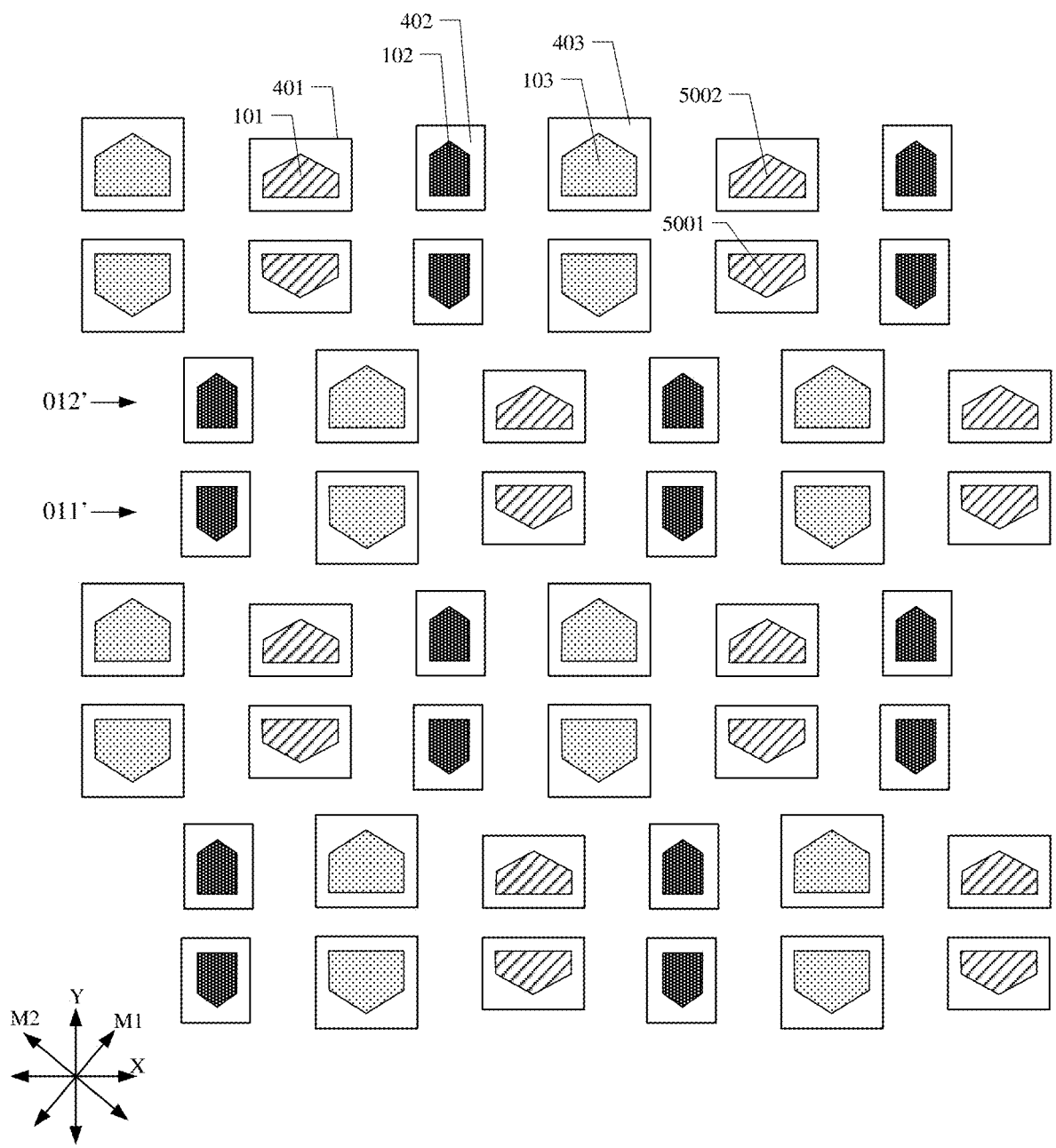
FIG. 10A schematically shows a partial schematic diagram of a sub-pixel arrangement in the display region of the display substrate according to other exemplary embodiments of the present disclosure.
Figure 10B:
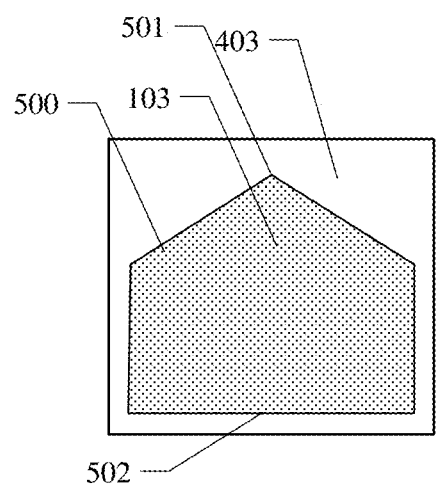
FIG. 10B shows an enlarged view of the single sub-pixel in FIG. 10A.
Figure 11A:
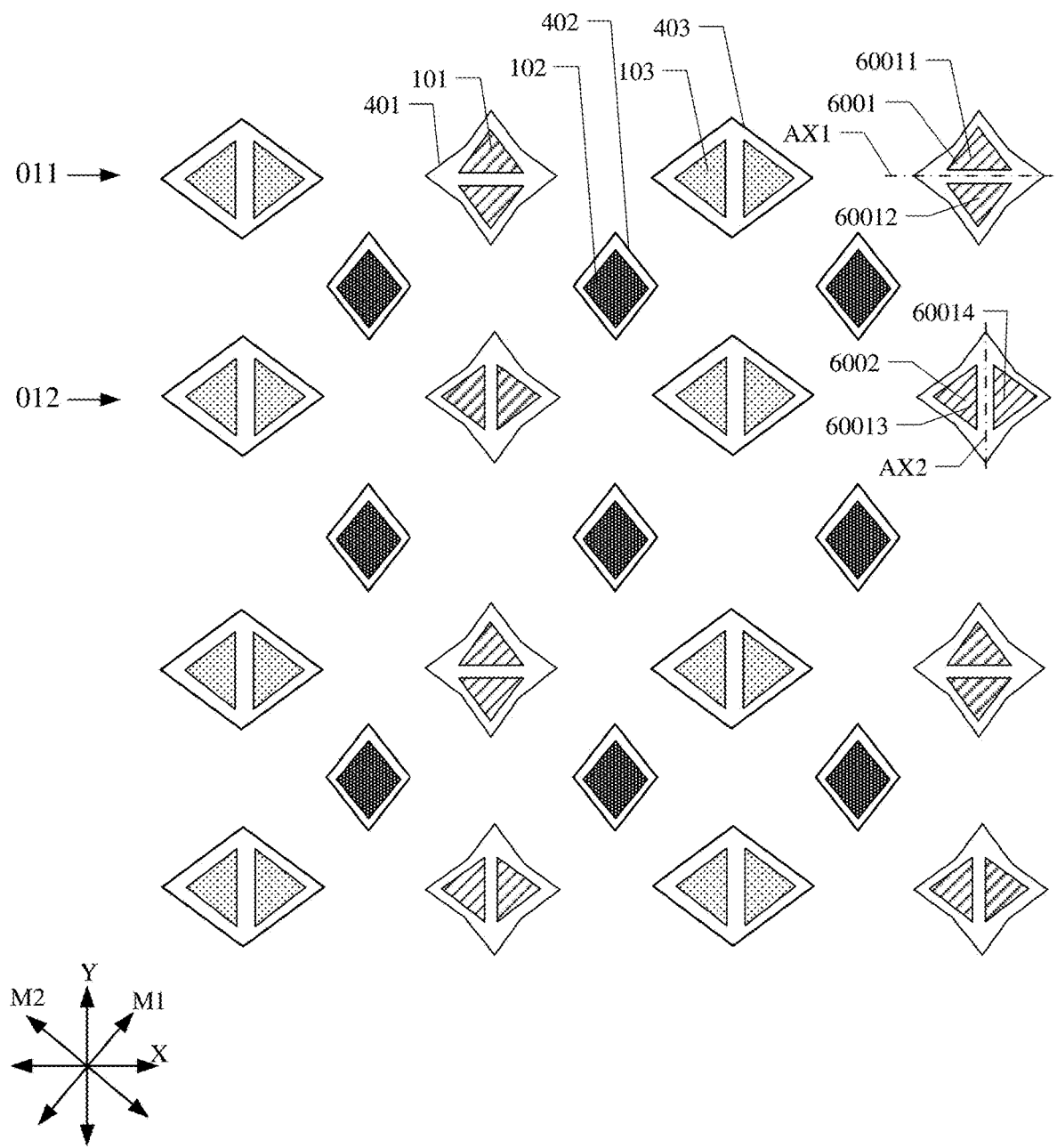
FIG. 11A schematically shows a partial schematic diagram of a sub-pixel arrangement in the display region of the display substrate according to other exemplary embodiments of the present disclosure.
Figure 11B:
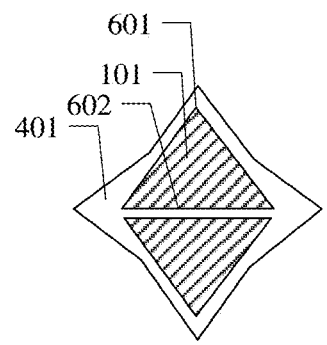
FIG. 11B shows an enlarged view of the single sub-pixel in FIG. 11A.

FIG. 4A schematically shows a partial schematic diagram of a sub-pixel arrangement in a display region of the display substrate according to some exemplary embodiments of the present disclosure. FIG. 4B shows an enlarged view of a single sub-pixel in FIG. 4A. FIG. 4C shows a schematic cross-sectional view taken along line CC' in FIG. 4B. FIG. 5 shows an enlarged view of an opening of the single sub-pixel shown in FIG. 4A. FIG. 6 schematically shows a simulation result of interferometric fringes in a case of the embodiments shown in FIG. 4A. FIG. 7 schematically shows a partial schematic diagram of a specific structure of an anode of the display substrate according to some exemplary embodiments of the present disclosure. FIG. 8A schematically shows a partial schematic diagram of a sub-pixel arrangement in the display region of the display substrate according to other exemplary embodiments of the present disclosure. FIG. 8B to FIG. 8D respectively show enlarged views of a single sub-pixel in the display region of the display substrate according to other exemplary embodiments of the present disclosure. FIG. 9A schematically shows a partial schematic diagram of a sub-pixel arrangement in the display region of the display substrate according to other exemplary embodiments of the present disclosure. FIG. 9B shows an enlarged view of the single sub-pixel in FIG. 9A. FIG. 10A schematically shows a partial schematic diagram of a sub-pixel arrangement in the display region of the display substrate according to other exemplary embodiments of the present disclosure. FIG. 10B shows an enlarged view of the single sub-pixel in FIG. 10A. FIG. 11A schematically shows a partial schematic diagram of a sub-pixel arrangement in the display region of the display substrate according to other exemplary embodiments of the present disclosure. FIG. 11B shows an enlarged view of the single sub-pixel in FIG. 11A.

It should be noted that in the following descriptions, partial content may refer to the above descriptions for FIG. 2A to FIG. 2C, and the following mainly describes contents different from those in FIG. 2A to FIG. 2C. Accordingly, in order to avoid confusion, components, elements or parts with the same or similar structure are denoted by the same reference numerals, and components, elements or parts with different structures or shapes are denoted by different reference numerals.

As shown in FIG. 4A, the display substrate 10 includes a plurality of sub-pixels. For example, the plurality of sub-pixels include a plurality of first color sub-pixels SP1, a plurality of second color sub-pixels SP2, and a plurality of third color sub-pixels SP3. The plurality of first color sub-pixels SP1 and the plurality of third color sub-pixels SP3 are alternately arranged in a first arrangement direction (X-direction shown in FIG. 4A, also called row direction) to form a first pixel row 01, and the plurality of second color sub-pixels SP2 are arranged in the first arrangement direction X to form a second pixel row 02. The first pixel row 01 and the second pixel row 02 are alternately arranged in a second arrangement direction (Y-direction shown in FIG.

4A, also called column direction) intersecting the first arrangement direction X and are staggered with each other in the first arrangement direction X. For example, adjacent first color sub-pixel SP1 and second color sub-pixel SP2 are arranged in a first direction M1, and the first direction M1 intersects the first arrangement direction X and the second arrangement direction Y. As shown in FIG. 4A, the plurality of first color sub-pixels SP1 and the plurality of third color sub-pixels SP3 are alternately arranged in the second arrangement direction Y to form a plurality of first pixel columns 03, and the plurality of second color sub-pixels SP2 are arrayed in the first arrangement direction X and the second arrangement direction Y to form a plurality of second pixel rows 02 and a plurality of second pixel columns 04. The plurality of first pixel columns 03 and the plurality of second pixel columns 04 are alternately arranged in the first arrangement direction X and staggered with each other in the second arrangement direction Y, that is, a second pixel row 02 where a second color sub-pixel SP2 is located between two adjacent first pixel rows 01, and a second pixel column 04 where the second color sub-pixel SP2 is located is located between two adjacent first pixel columns 03.

As shown in FIG. 4A, the display substrate includes a plurality of repetitive units A arranged in an array. Each repetitive unit A includes two rows and four columns of sub-pixels, that is, each repetitive unit A includes one first color sub-pixel SP1, one third color sub-pixel SP3 and two second color sub-pixels SP2. The first color sub-pixel SP1 and the third color sub-pixel SP3 are common sub-pixels, and the four sub-pixels may achieve a display of two dummy pixel units through a dummy algorithm. For example, in a row of repetitive units, the first color sub-pixel SP1 in a second repetitive unit, the third color sub-pixel SP3 in a first repetitive unit and the second color sub-pixel SP2 close to the second repetitive unit in the first repetitive unit form a dummy pixel unit. At the same time, the first color sub-pixel SP1 in the second repetitive unit further forms a dummy pixel unit with the third color sub-pixel SP3 in the second repetitive unit and the second color sub-pixel SP2 close to the first repetitive unit in the second repetitive unit. In addition, the third color sub-pixel SP3 in the second repetitive unit further forms a dummy pixel unit with the other second color sub-pixel SP2 in the second repetitive unit and the first color sub-pixel SP1 in a third repetitive unit. In this way, a resolution of the display substrate may be effectively improved.

As shown in FIG. 4A, each sub-pixel includes a light emitting region 200. For example, the display substrate 10 includes a pixel definition layer 8 arranged on the base substrate 1 (referring to FIG. 12). A shape of the light emitting region 200 of each sub-pixel is defined by an opening in the pixel definition layer 8, and then the shape of the light emitting region 200 of each sub-pixel is substantially the same as a shape of the opening of the pixel definition layer 8.

For example, with reference to FIG. 4A and FIG. 12, the pixel definition layer 8 includes a plurality of first openings 101, a plurality of second openings 102, and a plurality of third openings 103. The first opening 101 defines a first light emitting region of the first color sub-pixel SP1, the second opening 102 defines a second light emitting region of the second color sub-pixel SP2, and the third opening 103 defines a third light emitting region of the third color sub-pixel SP3.

FIG. 12 shows a schematic cross-sectional view taken along line AA' in FIG. 1, in which a specific structure of the display substrate according to some exemplary embodiments of the present disclosure is schematically shown. With reference to FIG. 1, FIG. 2, FIG. 4A and FIG. 12, the display substrate 10 includes pixel driving circuit layers sequentially stacked on the base substrate 1. The pixel driving circuit layer may include a thin film transistor T, an insulation layer 31, a planarization layer 32, and an organic light emitting element 41. The organic light emitting element 41 includes a first electrode (e.g., anode) 41A located in a first electrode layer, a second electrode (e.g., cathode) 41C located in a second electrode layer, and a light emitting layer 41B between the first electrode 41A and the second electrode 41C. The first electrode 41A of the organic light emitting element 41 is electrically connected to the transistor through an anode connecting hole VH1 penetrating the planarization layer 32. The pixel driving circuit layer may include a semiconductor layer, a first insulation layer, a first gate layer, a second insulation layer, a second gate layer, an interlayer insulation layer, a source/drain metal layer, and so on. In some embodiments, the pixel driving circuit may include seven thin film transistors (e.g., driving transistor, data writing transistor, compensation transistor, reset transistor, light emission control transistor, and so on) and a storage capacitor. At least one thin film transistor, such as the light emission control transistor, is directly connected to the light emitting device. Only one thin film transistor T is schematically shown in FIG. 12. The thin film transistor T includes at least an active layer located in the semiconductor layer, a source contact portion, a drain contact portion, a gate electrode located in the first gate layer, and a source electrode and a drain electrode located in the source/drain metal layers.

It should be noted that herein, unless otherwise specified, "via hole" or "connecting hole" is used to electrically connect components located in different conductive layers. In the embodiments of the present disclosure, "via hole" or "connecting hole" may also take other alternative forms. For example, the via hole or connecting hole may be replaced with a "groove" used to electrically connect components located in different conductive layers.

For example, the first electrode 41A may contain a transparent conductive material such as ITO, and the specific material of the first electrode 41A is not limited in the embodiments of the present disclosure. For example, the second electrode 41C may be a structure formed on an entire surface of the display substrate 10 (for example, at least completely covering an entire display region), and the second electrode 41C may contain, for example, lithium (Li), aluminum (Al), magnesium (Mg), silver (Ag) and other metal materials. For example, since the second electrode 41C may be formed as a very thin layer, it has good light transmittance.

The display substrate 10 may further include a pixel definition layer 8. For example, the pixel definition layer 8 may have a plurality of openings. For example, some openings are located in the display region AA, and each opening exposes a part of the first electrode of the organic light emitting element 41.

With reference to FIG. 7 and FIG. 12, the first electrode 41A includes an anode structure 413 and an anode connecting portion 422. At least part of the anode connecting portion 422 has a different thickness from the anode structure 413. Specifically, at the via hole VH1, the anode connecting portion 422 of the first electrode is connected to the source electrode or drain electrode of a lower thin film transistor. Therefore, the thickness of at least part of the anode connecting portion 422 is greater than the thickness of the anode structure 413.

It should be understood that the anode structure 413 is a body portion of the anode (i.e., the first electrode), and the anode connecting portion 422 is an auxiliary portion of the anode (that is, the first electrode) that is designed to facilitate an arrangement of the via hole VH1. In the embodiments of the present disclosure, only FIG. 7 schematically shows an overall structure of the anode. In other figures, a body outline of the anode is represented by the body portion (i.e. the anode structure) of the anode. That is, herein, unless otherwise specified, a pattern of the anode of each sub-pixel is represented by an orthographic projection of the anode structure on the base substrate.

Figure 13:
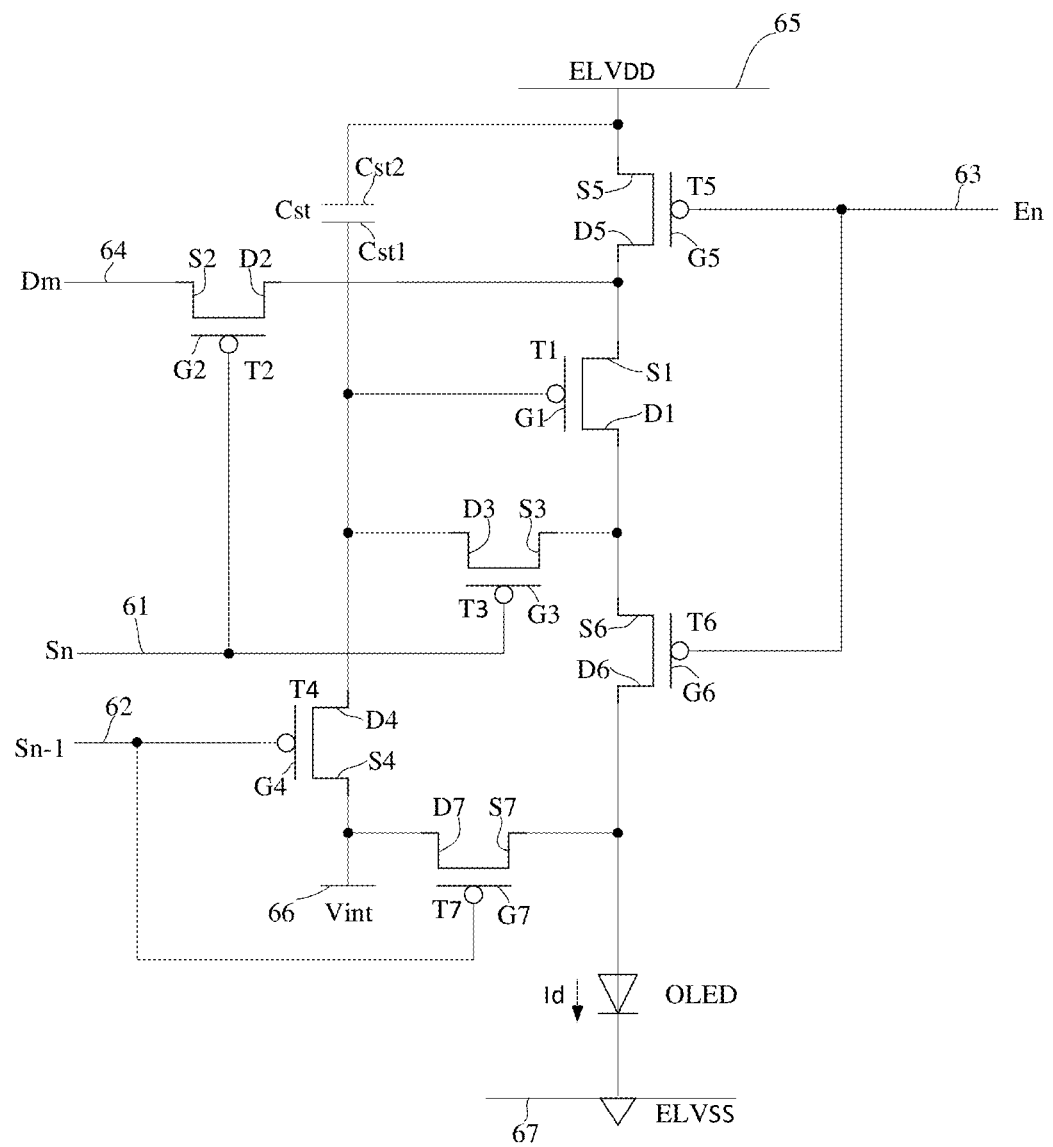
FIG. 13 shows an equivalent circuit diagram of a pixel driving circuit of the display substrate according to some exemplary embodiments of the present disclosure.

FIG. 13 shows an equivalent circuit diagram of the pixel driving circuit of the display substrate according to some exemplary embodiments of the present disclosure.

A 7T1C pixel driving circuit is illustrated below by way of example in describing a structure of the pixel driving circuit in detail. However, the embodiments of the present disclosure are not limited to the 7T1C pixel driving circuit. In a case of no conflict, any other known pixel driving circuit structures may be applied to the embodiments of the present disclosure.

As shown in FIG. 13, the pixel driving circuit may include a plurality of thin film transistors and a storage capacitor Cst. The pixel driving circuit is used to drive an organic light emitting diode (i.e., OLED). The plurality of thin film transistors include a first transistor T1, a second transistor T2, a third transistor T3, a fourth transistor T4, a fifth transistor T5, a sixth transistor T6, and a seventh transistor T7. Each transistor includes a gate electrode, a source electrode, and a drain electrode.

The display substrate may further include a plurality of signal lines. For example, the plurality of signal lines include: a scanning signal line 61 for transmitting a scanning signal Sn, a reset signal line 62 for transmitting a reset control signal RESET (that is, a scanning signal for a previous row), a light emission control line 63 for transmitting a light emission control signal En, a data line 64 for transmitting a data signal Dm, a driving voltage line 65 for transmitting a driving voltage VDD, an initialization voltage signal 66 for transmitting an initialization voltage Vint, and a power line 67 for transmitting a VSS voltage.

The first transistor T1 has a gate electrode G1 electrically connected to one end Cst1 of the storage capacitor Cst, a source electrode S1 electrically connected to the driving voltage line 65 via the fifth transistor T5, and a drain electrode D1 electrically connected to an anode of the OLED via the sixth transistor T6. The first transistor T1 may receive the data signal Dm according to a switching operation of the second transistor T2, so as to supply a driving current Id to the OLED.

The second transistor T2 has a gate electrode G2 electrically connected to the scanning signal line 61, a source electrode S2 electrically connected to the data line 64, and a drain electrode D2 electrically connected to the driving voltage line 65 via the fifth transistor T5 and also electrically connected to the source electrode S1 of the first transistor T1. The second transistor T2 may be turned on according to the scanning signal Sn transmitted through the scanning signal line 61, so that a switching operation is performed to transmit the data signal Dm transmitted to the data line 64 to the source electrode S1 of the first transistor T1.

The third transistor T3 has a gate electrode G3 electrically connected to the scanning signal line 61, a source electrode S3 electrically connected to the anode of the OLED via the sixth transistor T6 and also electrically connected to the drain electrode D1 of the first transistor T1, and a drain electrode D3 electrically connected to the end Cst1 (that is, a first capacitor electrode) of the storage capacitor Cst, a drain electrode D4 of the fourth transistor T4 and the gate electrode G1 of the first transistor T1. The third transistor T3 may be turned on according to the scanning signal Sn transmitted through the scanning signal line 61, so as to electrically connect the gate electrode G1 and the drain electrode D1 of the first transistor T1, so that a diode connection of the first transistor T1 is performed.

The fourth transistor T4 has a gate electrode G4 electrically connected to the reset control signal line 62, a source electrode S4 electrically connected to the initialization voltage line 66, and a drain electrode D4 electrically connected to the end Cst1 of the storage capacitor Cst, the drain electrode D3 of the third transistor T3 and the gate electrode G1 of the first transistor T1. The fourth transistor T4 may be turned on according to the reset control signal Sn-1 transmitted through the reset control signal line 62, so as to transmit the initialization voltage Vint to the gate electrode G1 of the first transistor T1, so that an initialization operation is performed to initialize the voltage of the gate electrode G1 of the first transistor T1.

The fifth transistor T5 has a gate electrode G5 electrically connected to the light emission control line 63, a source electrode S5 electrically connected to the driving voltage line 65, and a drain electrode D5 electrically connected to the source electrode S1 of the first transistor T1 and the drain electrode D2 of the second transistor T2.

The sixth transistor T6 has a gate electrode G6 electrically connected to the light emission control line 63, a source electrode S6 electrically connected to the drain electrode D1 of the first transistor T1 and also electrically connected to the source electrode S3 of the third transistor T3, and a drain electrode D6 electrically connected to the anode of the OLED. The fifth transistor T5 and the sixth transistor T6 may be turned on concurrently (for example, simultaneously) according to the light emission control signal En transmitted through the light emission control line 63, so as to transmit the driving voltage ELVDD to the OLED, thereby allowing the driving current Id to flow into the OLED.

The seventh transistor T7 includes a gate electrode G7 connected to the reset control signal line 62, a source electrode S7 connected to the drain electrode D6 of the sixth transistor T6 and the anode of the OLED, and a drain electrode D7 connected to the initialization voltage line 66. The seventh transistor T7 may transmit the reset control signal Sn-1 from the reset control signal line 62 to the gate electrode G7.

The other end Cst2 of the storage capacitor Cst is electrically connected to the driving voltage line 65, and the cathode of the OLED is electrically connected to the power line 67 to receive the common voltage ELVSS. Accordingly, the OLED may receive the driving current Id from the first transistor T1 to emit light, so as to display an image.

It should be noted that in FIG. 13, the thin film transistors T1, T2, T3, T4, T5, T6 and T7 are p-channel field effect transistors. However, the embodiments of the present disclosure are not limited thereto. At least some of the thin film transistors T1, T2, T3, T4, T5, T6 and T7 may be n-channel field effect transistors.

In operation, in an initialization stage, the reset control signal Sn-1 having a low level is supplied through the reset control signal line 62. Subsequently, the initialization thin film transistor T4 may be turned on based on the low level of the reset control signal Sn-1, and the initialization voltage Vint from the initialization voltage line 66 is transmitted to the gate electrode G1 of the driving thin film transistor T1 through the initialization thin film transistor T4. Accordingly, the driving thin film transistor T1 is initialized due to the initialization voltage Vint.

In a data programming stage, the scanning signal Sn having a low level is supplied through the scanning signal line 61. Subsequently, the switching thin film transistor T2 and the compensation thin film transistor T3 may be turned on based on the low level of the scanning signal Sn. Accordingly, the driving thin film transistor T1 is placed in a diode-connected state through the turned-on compensation thin film transistor T3 and is biased in a forward direction.

Subsequently, a compensation voltage Dm+Vth (for example, Vth is a negative value) obtained by subtracting the threshold voltage Vth of the driving thin film transistor T1 from the data signal Dm supplied via the data line 64 is applied to the gate electrode G1 of the driving thin film transistor T1. Next, the driving voltage ELVDD and the compensation voltage Dm+Vth are applied to both ends of the storage capacitor Cst, so that an electric charge corresponding to a voltage difference between the ends is stored in the storage capacitor Cst.

In a light emission stage, the light emission control signal En from the light emission control line 63 changes from a high level to a low level. Then, in the light emission stage, the first light emission control thin film transistor T5 and the second light emission control thin film transistor T6 may be turned on based on the low level of the light emission control signal En.

Next, a driving current is generated based on a difference between the voltage of the gate electrode G1 of the driving thin film transistor T1 and the driving voltage ELVDD. The driving current Id corresponding to the difference between the driving current and a bypass current is supplied to the OLED through the second light emission control thin film transistor T6.

In the light emission stage, based on a current-voltage relationship of the driving thin film transistor T1, a gate-source voltage of the driving thin film transistor T1 is maintained at (Dm+Vth)-ELVDD due to the storage capacitor Cst. The driving current Id is proportional to (Dm-ELVDD)2. Therefore, the driving current Id may not be affected by a variation of the threshold voltage Vth of the driving thin film transistor T1.

For example, in various embodiments of the present disclosure, the base substrate 1 may be a glass substrate, a quartz substrate, a metal substrate, or a resin substrate, and so on, and may be a rigid substrate or a flexible substrate, which is not limited in the embodiments of the present disclosure.

For example, with reference to FIG. 4A and FIG. 12, the display substrate 10 includes a first electrode layer located on the base substrate 1, and the first electrode layer includes a plurality of anode structures. The anode structure constitutes a body portion of the anode of the organic light emitting element. For convenience of description, the anode structure included in the organic light emitting element of the first color sub-pixel SP1 may be called a first anode structure 401, the anode structure included in the organic light emitting element of the second color sub-pixel SP2 may be called a second anode structure 402, and the anode structure included in the organic light emitting element of the third color sub-pixel SP3 may be called a third anode structure 403.

With reference to FIG. 4A, FIG. 8A, FIG. 9A, FIG. 10A and FIG. 11A, an orthographic projection of the opening of the pixel definition layer on the base substrate is located in an orthographic projection of the corresponding light emitting layer on the base substrate, that is, the light emitting layer covers the opening of the pixel definition layer. An orthographic projection of the opening of each sub-pixel on the base substrate falls into the orthographic projection of the corresponding anode structure on the base substrate. For example, the orthographic projection of the first opening 101 of the first color sub-pixel SP1 on the base substrate 1 falls into the orthographic projection of the first anode structure 401 of the first color sub-pixel SP1 on the base substrate 1, the orthographic projection of the second opening 102 of the second color sub-pixel SP2 on the base substrate 1 falls into the orthographic projection of the second anode structure 402 of the second color sub-pixel SP2 on the base substrate 1, and the orthographic projection of the third opening 103 of the third color sub-pixel SP3 on the base substrate 1 falls into the orthographic projection of the third anode structure 403 of the third color sub-pixel SP3 on the base substrate 1. In the embodiments of the present disclosure, the anode structure has a larger area than the opening, which may help to ensure that the organic luminescent material in the opening of the sub-pixel emits light uniformly.

With reference to FIG. 4A to FIG. 4C, FIG. 8A to FIG. 8D, FIG. 9A to FIG. 9B, FIG. 10A to FIG. 10B and FIG. 11A to FIG. 11B, for at least some sub-pixels of the plurality of sub-pixels, a figure of the orthographic projection of the opening of each sub-pixel on the base substrate has a different shape from a figure of the orthographic projection of the anode structure of the sub-pixel on the base substrate; and the figure of the orthographic projection of the anode structure of each sub-pixel on the base substrate has a greater number of symmetry axis than the figure of the orthographic projection of the opening of the sub-pixel on the base substrate.

For example, in the embodiments shown in FIG. 4A and FIG. 8A, the orthographic projection of the first opening 101 of the first color sub-pixel SP1 on the base substrate 1 has a shape of rounded rectangle. Accordingly, the orthographic projection of the first anode structure 401 of the first color sub-pixel SP1 on the base substrate 1 also has the shape of rounded rectangle. The orthographic projection of the second opening 102 of the second color sub-pixel SP2 on the base substrate 1 has a shape of rounded rectangle. Accordingly, the orthographic projection of the second anode structure 402 of the second color sub-pixel SP2 on the base substrate 1 also has the shape of rounded rectangle.

Referring to FIG. 4A, the orthographic projection of the third opening 103 of the third color sub-pixel SP3 on the base substrate 1 has an irregular shape, for example, which is obtained by cutting off a vertex angle from a rectangle, as shown in FIG. 5. In contrast, the orthographic projection of the third anode structure 403 of the third color sub-pixel SP3 on the base substrate 1 has a regular shape, such as a rectangle or a rounded rectangle.

Referring to FIG. 8A, the orthographic projection of the third opening 103 of the third color sub-pixel SP3 on the base substrate 1 has an irregular shape, for example, which is obtained by cutting off a vertex angle from a rectangle, as shown in FIG. 5. However, the orthographic projection of the third anode structure 403 of the third color sub-pixel SP3 on the base substrate 1 has a regular shape, such as a circle.

In the embodiments shown in FIG. 4A and FIG. 8A, it is schematically shown that the shape of the opening of each sub-pixel is a figure including rounded corners, then the shape of the light emitting region of each sub-pixel is also a figure including rounded corners, and for example, the shape of the anode structure of each sub-pixel may also be a figure including rounded corners. The figure of the opening of the pixel definition layer may include four straight sides, at least two adjacent straight sides are connected by a curve segment, and the curve segment forms a rounded corner. However, the embodiments of the present disclosure are not limited thereto. The figure of the light emitting region of each sub-pixel may also include three straight sides, five straight sides or six straight sides. Then, the number of vertex angles included in the light emitting region may change accordingly.

With reference to FIG. 4A, FIG. 4B, FIG. 8A and FIG. 8B, for at least some sub-pixels in the plurality of sub-pixels, the figure of the orthographic projection of the anode structure of each sub-pixel on the base substrate is non-proportionally enlarged with respect to the figure of the orthographic projection of the opening of the sub-pixel on the base substrate.

FIG. 5 shows a schematic diagram of the shape of the light emitting region shown in FIG. 4A or FIG. 8A. As shown in FIG. 4A, FIG. 8A and FIG. 5, sides or extension lines of the sides of each light emitting region 200 are connected in sequence to form a polygon 300, and a plurality of vertex angles 301 of the polygon 300 of at least some sub-pixels include regions NO not overlapping with a plurality of corner portions 001 of the corresponding light emitting region 200. The plurality of corner portions 001 of the light emitting region 200 of at least one sub-pixel include at least a first corner portion 1011. The region NO where the first corner portion 1011 does not overlap the corresponding vertex angle 301 of the polygon 300 has a larger area than the region NO where each of at least some corner portions 001 among the other corner portions 001 does not overlap the corresponding vertex angle 301 of the polygon 300.

For example, FIG. 5 schematically shows that all the vertex angles of the polygon 300 have a region NO not overlapping the corresponding corner portion 001 of the corresponding light emitting region 200, but the present disclosure is not limited thereto. It is also possible that some vertex angles of the polygon have a region not overlapping the corresponding corner portion of the light emitting region, and some vertex angles completely overlap the corresponding corner portions of the light emitting region.

For example, as shown in FIG. 4A and FIG. 5, in at least two different types of color sub-pixels (for example, the first color sub-pixel and the second color sub-pixel, or the first color sub-pixel and the third color sub-pixel, or the second color sub-pixel and the third color sub-pixel, or the first color sub-pixel, the second color sub-pixel and the third color sub-pixel), the shape of the light emitting region 200 is obtained by cutting off at least one first vertex angle 301 from the polygon 300. For example, a cut line 302 used to cut off the first vertex angle 301 from the polygon 300 may include a line segment with a regular shape, such as a curve or a straight line, or may be a line segment with an irregular shape.

For example, the embodiments of the present disclosure schematically show that the polygon 300 is a quadrilateral. For example, the shape of the polygon corresponding to at least one type of color sub-pixel may be a rhombus, a rectangle or a square, but the present disclosure is not limited thereto. The polygon 300 may also be a triangle, a pentagon or a hexagon, etc., which is not limited in the embodiments of the present disclosure. For example, the vertex angles of the polygon may be equal or unequal.

As shown in FIG. 4A, FIG. 4B and FIG. 5, the vertex angles of the light emitting region (or opening) 101 include a first corner portion 1011, which is obtained by cutting off the first vertex angle 301 between two first sides 310 from the polygon 300. For example, a length ratio of a portion L1 cut off from at least one of the two sides 310 to a length of the first side 310 is in a range of 0.2 to 0.8. A remaining portion L2 of the first side 310 of the polygon 300 obtained by cutting off the first line segment L1 forms a side connected with the first corner portion 1011 of the light emitting region 200. For example, two ends of the first corner portion 1011 are respectively connected with two straight sides of the light emitting region 200, and at least one straight side of the two straight sides is a remaining straight side of the first side 310 of the polygon 300 obtained by cutting off the first line segment L1.

For example, at least one first vertex angle 301 may be cut off from the polygon 300 to form at least one first corner portion 1011. For example, the polygon 300 includes a plurality of first vertex angles 301 with equal degrees, and a plurality of first corner portions 1011 formed by cutting off the plurality of first vertex angles 301 have equal parameters such as shapes and sizes.

The ratio of the length of the first line segment L1 to the length of the first side 310 is in a range of 0.2 to 0.8. For example, the ratio of the length of the first line segment L1 to the length of the first side 310 is in a range of 0.3 to 0.7. For example, the ratio of the length of the first line segment L1 to the length of the first side 310 is in a range of 0.4 to 0.6. For example, the ratio of the length of the first line segment L1 to the length of the first side 310 is 0.5.

For example, the ratio of the length of the first line segment L1 to the length of the remaining part L2 is in a range of 0.25 to 4. For example, the ratio of the length of the first line segment L1 to the length of the remaining part L2 is in a range of 1 to 3. For example, the ratio of the length of the first line segment L1 to the length of the remaining part L2 is in a range of 0.5 to 2.

For example, at least two different types of color sub-pixels include different numbers of first corner portions 1011. For example, at least two different types of color sub-pixels including different numbers of first corner portions 1011 may mean that the sub-pixels having the same color include the same number of first corner portions, while in two sub-pixels having different colors, the number of first corner portion in one sub-pixel is different from the number of first corner portion in the other sub-pixel having a different color. For example, at least two different types of color sub-pixels including different numbers of first corner portions 1011 may also mean that the sub-pixels having the same color include the same number of first corner portions, while the sub-pixels having different colors include different total numbers of first corner portions due to different numbers of the sub-pixels having difference colors.

For example, different numbers of first corner portions 1011 in at least two sub-pixels having different colors may help to adjust a brightness center in at least part of the display region to obtain a more uniform distribution.

For example, as shown in FIG. 4A, the light emitting regions 200 of sub-pixels having the same color may have the same area, and the light emitting regions 200 of sub-pixels having different colors may have different areas.

For example, when the light emitting region 200 includes one first corner portion 1011, a geometric center of the light emitting region 200 is located on a side of a midpoint of a connecting line 303, which is between a vertex of the first vertex angle 301 and a vertex of a vertex angle opposite to the first corner portion 1011, away from the first corner portion 1011. By adjusting the geometric center of at least part of the light emitting regions, the brightness center in at least part of the display region may be adjusted to obtain a more uniform distribution more.

For example, as shown in FIG. 4A and FIG. 5, in the display substrate provided by the embodiments of the present disclosure, the shapes of some sub-pixels may be adjusted so that in at least two types of color sub-pixels among the first color sub-pixel, the second color sub-pixel and the third color sub-pixel, a distance from the geometric center of the light emitting region of the sub-pixel to an intersection point of extension lines of two straight lines connected with two ends of the first corner portion is different from a distance from the geometric center of the light emitting region of the sub-pixel to an intersection point of two straight lines or their extension lines forming the vertex angle opposite to the first corner portion of the light emitting region, so as to adjust an actual brightness center of each dummy pixel unit to obtain a more uniform distribution of actual brightness centers in the display substrate.

For example, the number of first corner portion 1011 in a type of color sub-pixel is one, and the number of first corner portion 1011 in another type of color sub-pixel is greater than one, and may be, for example, two, three or four. For example, the number of first corner portion 1011 in a type of color sub-pixel may be two, and the number of first corner portion 1011 in another type of color sub-pixel may be three or four. For example, the number of first corner portion 1011 in a type of color sub-pixel may be three, and the number of first corner portion 1011 in another type of color sub-pixel may be four. The embodiments of the present disclosure do not limit the number of first corner portion of different color sub-pixels, which may be set according to actual product requirements.

For example, the first corner portion 1011 includes a vertex P1, which may be on the connecting line 303. A curve (i.e., an outer edge of the first corner portion) is formed by extending two sides connected with two ends of the first corner portion 1011 to the vertex P1, and then the first corner portion 1011 is a rounded chamfer. In this case, the first corner portion 1011 may be in a range of x microns along the outline centered on the vertex P1, and a value of x may be in a range of 2 microns to 7 microns. When the first corner portion is a rounded chamfer and the vertex angle opposite to the first corner portion in the shape of the light emitting region is a right angle or an acute angle, a distance from the geometric center O1 of the light emitting region 200 to the intersection point of the extension lines of the two straight sides connected with the two ends of the first corner portion is greater than a distance from the geometric center O1 to the intersection point of the extension lines of the two straight sides forming the vertex angle opposite to the first corner portion.

The above-mentioned "rounded chamfer" refers to a vertex angle formed by a curve. The curve may be an arc, or may be an irregular curve such as a curve extracted from an ellipse, a wavy line, and so on. The embodiments of the present disclosure schematically show that the curve has a convex shape with respect to the geometric center O1 of the light emitting region 200, but the present disclosure is not limited thereto. The curve may also have a concave shape with respect to the geometric center O1 of the light emitting region 200. For example, when the curve is a convex arc, a center angle of the arc may range from 10° to 150°. For example, the center angle of the arc may range from 60° to 120°. For example, the center angle of the arc may be 90°. For example, a curve length of the rounded chamfer included in the first corner portion 1011 may be in a range of 10 microns to 60 microns.

For example, when the first corner portion 1011 is a rounded chamfer, a radius of curvature may be in a range of 5 microns to 20 microns.

Referring to FIG. 4A, for at least some sub-pixels (for example, at least some third color sub-pixels SP3) in the plurality of sub-pixels, the figure of the orthographic projection of the anode structure of each sub-pixel on the base substrate has a different number of symmetry axis from the figure of the orthographic projection of the opening of the sub-pixel on the base substrate. In the embodiments shown in FIG. 4A, for at least some sub-pixels (for example, at least some third color sub-pixels SP3) in the plurality of sub-pixels, the number of symmetry axis of the figure of the orthographic projection of the anode structure of each sub-pixel on the base substrate is greater than the number of symmetry axis of the figure of the orthographic projection of the opening of the sub-pixel on the base substrate. For example, the figure of the orthographic projection of the opening 103 of the third color sub-pixel SP3 on the base substrate has one symmetry axis, and the figure of the orthographic projection of the anode structure of the third color sub-pixel SP3 on the base substrate has at least two symmetry axes. In the embodiments shown in FIG. 8A, for example, the figure of the orthographic projection of the opening 103 of the third color sub-pixel SP3 on the base substrate has one symmetry axis, and the figure of the orthographic projection of the anode structure of the third color sub-pixel SP3 on the base substrate has infinite symmetry axes.

For example, as shown in FIG. 4A and FIG. 8A, the third sub-pixels SP3 include four types of sub-pixels, which are respectively referred to as a first type of sub-pixel 1001, a second type of sub-pixel 1002, a third type of sub-pixel 1003 and a fourth type of sub-pixel 1004 for convenience of description. In the first type of sub-pixel 1001, the second type of sub-pixel 1002, the third type of sub-pixel 1003 and the fourth type of sub-pixel 1004, directions from the vertex of the first corner portion 1011 to the vertex of the second corner portion 1012 are respectively direction D2, direction D3, direction D4 and direction D1. For example, in the opening of the first type of sub-pixel 1001, the direction from the vertex of the first corner portion 1011 to the vertex of the second corner portion 1012 is the direction D2; in the opening of the second type of sub-pixel 1002, the direction from the vertex of the first corner portion 1011 to the vertex of the second corner portion 1012 is the direction D3; in the opening of the third type of sub-pixel 1003, the direction from the vertex of the first corner portion 1011 to the vertex of the second corner portion 1012 is the direction D4; in the opening of the fourth type of sub-pixel 1004, the direction from the vertex of the first corner portion 1011 to the vertex of the second corner portion 1012 is the direction D1.

Here, for convenience of description, the opening of the first type of sub-pixel 1001 is called a first type of opening, the opening of the second type of sub-pixel 1002 is called a second type of opening, the opening of the third type of sub-pixel 1003 is called a third type of opening, the opening of the fourth type of sub-pixel 1004 is called a fourth type of opening, and so on.

Referring to FIG. 4A and FIG. 8A, for at least one first type of opening, two second type of openings are adjacent to the first type of opening in the first arrangement direction X, two second type of openings are adjacent to the first type of opening in the second arrangement direction Y, two third type of openings are adjacent to the first type of opening in the first direction M1, and two fourth type of openings are adjacent to the first type of opening in the second direction M2.

At least one of a figure of an orthographic projection of the first type of opening on the base substrate 1 and a figure of an orthographic projection of the second type of opening on the base substrate 1 is only symmetrical with respect to a first symmetry axis AX1 extending in the second arrangement direction Y. A figure of an orthographic projection of each anode structure 413 respectively covering the first type of opening and the second type of opening on the base substrate 1 is symmetrical with respect to the first symmetry axis AX1 extending in the second arrangement direction Y and a second symmetry axis AX2 extending in the first arrangement direction X.

At least one of a figure of an orthographic projection of the third type of opening on the base substrate 1 and a figure of an orthographic projection of the fourth type of opening on the base substrate 1 is only symmetrical with respect to the second symmetry axis AX2 extending in the first arrangement direction X. A figure of an orthographic projection of each anode structure 413 respectively covering the third type of opening and the fourth type of opening on the base substrate 1 is symmetrical with respect to the second symmetry axis AX2 extending in the first arrangement direction X and the first symmetry axis AX1 extending in the second arrangement direction Y.

For at least some sub-pixels in the plurality of sub-pixels, a geometric center of the figure of the orthographic projection of the anode structure of each sub-pixel on the base substrate does not coincide with a geometric center of the figure of the orthographic projection of the opening of the sub-pixel on the base substrate. For example, with reference to FIG. 4A, FIG. 4B, FIG. 5, FIG. 8A and FIG. 8B, for at least some third color sub-pixels SP3, the figure of the orthographic projection of the anode structure 403 of the third color sub-pixel SP3 on the base substrate is a regular figure, which may be, for example, a rectangle, a rounded rectangle or a circle. In this case, a geometric center O2 of the figure of the orthographic projection of the anode structure 403 of the third color sub-pixel SP3 on the base substrate is an intersection point of two diagonal lines of the rectangle. The geometric center O2 of the figure of the orthographic projection of the anode structure 403 of the third color sub-pixel SP3 on the base substrate 1 does not coincide with the geometric center O1 of the figure of the orthographic projection of the opening 103 of the sub-pixel on the base substrate 1.

Referring to FIG. 4A and FIG. 8A, for at least some sub-pixels in the plurality of sub-pixels, the geometric center O2 of the figure of the orthographic projection of the anode structure 413 of at least one sub-pixel (e.g., the third color sub-pixel SP3) on the base substrate 1 is offset in the first arrangement direction X with respect to the geometric center O1 of the figure of the orthographic projection of the opening 103 of the sub-pixel on the base substrate 1; and/or the geometric center O2 of the figure of the orthographic projection of the anode structure 413 of at least one sub-pixel (e.g., the third color sub-pixel SP3) on the base substrate is offset in the second arrangement direction Y with respect to the geometric center O1 of the figure of the orthographic projection of the opening 103 of the sub-pixel on the base substrate 1.

In the first type of sub-pixel 1001, the geometric center O2 of the figure of the orthographic projection of the anode structure 413 on the base substrate 1 is offset in the direction D3, that is, offset downward in the second arrangement direction Y, with respect to the geometric center O1 of the figure of the orthographic projection of the opening 103 of the sub-pixel on the base substrate 1. In the second type of sub-pixel 1002, the geometric center O2 of the figure of the orthographic projection of the anode structure 413 on the base substrate 1 is offset in the direction D2, that is, offset upward in the second arrangement direction Y, with respect to the geometric center O1 of the figure of the orthographic projection of the opening 103 of the sub-pixel on the base substrate 1. In the third type of sub-pixel 1003, the geometric center O2 of the figure of the orthographic projection of the anode structure 413 on the base substrate 1 is offset in the direction D1, that is, offset leftward in the first arrangement direction X, with respect to the geometric center O1 of the figure of the orthographic projection of the opening 103 of the sub-pixel on the base substrate 1. In the fourth type of sub-pixel 1004, the geometric center O2 of the figure of the orthographic projection of the anode structure 413 on the base substrate 1 is offset in the direction D4, that is, offset rightward in the first arrangement direction X, with respect to the geometric center O1 of the figure of the orthographic projection of the opening 103 of the sub-pixel on the base substrate 1.

With reference to FIG. 4B, FIG. 4C, FIG. 5, FIG. 8A and FIG. 8B, the figure of the orthographic projection of the opening 103 of some third color sub-pixels SP3 on the base substrate 1 has a first symmetry axis AX1, a first vertex P1 and a second vertex P2. The first vertex P1 and the second vertex P2 are located on the first symmetry axis AX1, and the first vertex P1 and the second vertex P2 are arranged opposite to each other. For example, the first vertex P1 is a vertex at the first corner portion 1011, and the second vertex P2 is a vertex at the second corner portion 1012.

The first symmetry axis AX1 and the figure of the orthographic projection of the anode structure 413 of the sub-pixel on the base substrate 1 have a first intersection point Q1 adjacent to the first vertex P1 and a second intersection point Q2 adjacent to the second vertex P2.

In an extension direction of the first symmetry axis AX1, a distance sd1 between the first vertex P1 and the first intersection point Q1 is not equal to a second distance sd2 between the second vertex P2 and the second intersection point Q2. For example, in the extension direction of the first symmetry axis AX1, the first distance sd1 between the first vertex P1 and the first intersection point Q1 is greater than the second distance sd2 between the second vertex P2 and the second intersection point Q2. For example, a ratio of the first distance sd1 to the second distance sd2 is greater than 1.2, for example, in a range of 1.2 to 5, in a range of 1.2 to 4, in a range of 1.3 to 3, or in a range of 1.4 to 2.

Referring to FIG. 4C, in a first cross-sectional view, the pixel definition layer 8 on both sides of the opening 103 of the sub-pixel covers parts of the anode structure 413 of the sub-pixel respectively, and a width (e.g., sd1) of one part of the anode structure 413 covered by the pixel definition layer 8 on one side of the opening of the sub-pixel is not equal to a width (e.g., sd2) of the other part of the anode structure 413 covered by the pixel definition layer 8 on the other side of the opening of the sub-pixel. The first cross section is perpendicular to a surface of the first electrode layer in contact with the pixel definition layer, and the first symmetry axis AX1 is located on the first cross section.

Referring to FIG. 4A, the plurality of sub-pixels include an $n^{th}$ row of sub-pixels 011 and an $(n+2)^{th}$ row of sub-pixels 012. For example, the plurality of sub-pixels may further include an $(n+1)^{th}$ row of sub-pixels 02. The $n^{th}$ row of sub-pixels 011 and the $(n+2)^{th}$ row of sub-pixels 012 may include a plurality of sub-pixels having the same color (for example, the first color sub-pixels SP1 or the third color sub-pixels SP3) arranged in the first arrangement direction X, and the $n^{th}$ row of sub-pixels 011 and the $(n+2)^{th}$ row of sub-pixels 012 are arranged in the second arrangement direction Y. For example, in such embodiments, the $n^{th}$ row of sub-pixels 011 may include the first color sub-pixels SP1 and the third color sub-pixels SP3 alternately arranged in the first arrangement direction X, the (n+1)' h row of sub-pixels 02 may include the second color sub-pixels SP2 arranged in the first arrangement direction X, and the $(n+2)^{th}$ row of sub-pixels 011 may include the first color sub-pixels SP1 and the third color sub-pixels SP3 alternately arranged in the first arrangement direction X.

The $n^{th}$ row of sub-pixel 011 include a first sub-pixel (e.g., a third color sub-pixel SP3), and the $(n+2)^{th}$ row of sub-pixels 012 include a second sub-pixel (e.g., a third color sub-pixel SP3). The second sub-pixel is a sub-pixel closest to the first sub-pixel in the first arrangement direction and having the same color as the first sub-pixel among the plurality of sub-pixels in the $(n+2)^{th}$ row of sub-pixels. The figure of the orthographic projection of the opening 103 of the first sub-pixel on the base substrate 1 is not in translational coincidence with the figure of the orthographic projection of the opening 103 of the second sub-pixel on the base substrate 1. The figure of the orthographic projection of the anode structure 401 of the first sub-pixel on the base substrate 1 is in translational coincidence with the figure of the orthographic projection of the anode structure 402 of the second sub-pixel on the base substrate 1.

In the sub-pixels having the same color in the $n^{th}$ row of sub-pixel 011 and the $(n+2)^{th}$ row of sub-pixels 012, the figure of the orthographic projection of the opening 103 of at least part of the sub-pixels on the base substrate 1 is not in translational coincidence with the figure of the orthographic projection of the opening 103 of the other part of the sub-pixels on the base substrate 1. The figures of the orthographic projections of the anode structures 413 of all sub-pixels on the base substrate 1 are in translational coincidence with each other.

Continuing to refer to FIG. 4A, the plurality of sub-pixels include an $m^{th}$ column of sub-pixels 031 and an $(m+2)^{th}$ column of sub-pixels 032. For example, the plurality of sub-pixels may further include an $(m+1)^{th}$ column of sub-pixels 04. The $m^{th}$ column of sub-pixels 031 and the $(m+2)^{th}$ column of sub-pixels 032 may include a plurality of sub-pixels having the same color (for example, the first color sub-pixels SP1 or the third color sub-pixels SP3) arranged in the second arrangement direction Y, and the $m^{th}$ column of sub-pixels 031 and the $(m+2)^{th}$ column of sub-pixels 032 are arranged in the first arrangement direction X. For example, in such embodiments, the $m^{th}$ column of sub-pixels 031 may include the first color sub-pixels SP1 and the third color sub-pixels SP3 alternately arranged in the second arrangement direction Y, the $(m+1)^{th}$ column of sub-pixels 04 may include the second color sub-pixels SP2 arranged in the second arrangement direction Y, and the $(m+2)^{th}$ column of sub-pixels 032 may include the first color sub-pixels SP1 and the third color sub-pixels SP3 alternately arranged in the second arrangement direction Y.

The $m^{th}$ column of sub-pixels 031 include a third sub-pixel (e.g., a third color sub-pixel SP3), and the $(m+2)^{th}$ column of sub-pixels 032 include a fourth sub-pixel (e.g., another third color sub-pixel SP3). The fourth sub-pixel is a sub-pixel closest to the third sub-pixel in the second arrangement direction and having the same color as the third sub-pixel among the plurality of sub-pixels in the $(m+2)^{th}$ column of sub-pixels. The figure of the orthographic projection of the opening 103 of the third sub-pixel on the base substrate 1 is not in translational coincidence with the figure of the orthographic projection of the opening 103 of the fourth sub-pixel on the base substrate 1. The figure of the orthographic projection of the anode structure 401 of the third sub-pixel on the base substrate 1 is in translational coincidence with the figure of the orthographic projection of the anode structure 402 of the fourth sub-pixel on the base substrate 1.

In the sub-pixels having the same color in the $m^{th}$ column of sub-pixels 03 1and the $(m+2)^{th}$ column of sub-pixels 032, the figure of the orthographic projection of the opening 103 of at least part of the sub-pixels on the base substrate 1 is not in translational coincidence with the figure of the orthographic projection of the opening 103 of the other part of the sub-pixels on the base substrate 1. The figures of the orthographic projections of the anode structures 413 of all sub-pixels on the base substrate 1 are in translational coincidence with each other.

Referring to FIG. 4A, for the $n^{th}$ row of sub-pixels 011 and the $(n+2)^{th}$ row of sub-pixels 012, in the $n^{th}$ row of sub-pixels 011, the first type of openings and the second type of openings are alternately arranged in the first arrangement direction X; in the $(n+2)^{th}$ row of sub-pixels 012, the third type of openings and the fourth type of openings are alternately arranged in the first arrangement direction.

For the $m^{th}$ column of sub-pixels and the $(m+2)^{th}$ column of sub-pixels, in the $m^{th}$ column of sub-pixels, the first type of openings and the second type of openings are alternately arranged in the second arrangement direction; in the $(m+2)^{th}$ column of sub-pixels, the third type of openings and the fourth type of openings are alternately arranged in the second arrangement direction.

Continuing to refer to FIG. 4A, for at least one type of sub-pixels having the same color (e.g., the third color sub-pixels SP3) among the plurality of sub-pixels, an arrangement pitch of the figures of the orthographic projections of the openings 103 of the plurality of sub-pixels having the same color on the base substrate 1 in the first arrangement direction X is a first arrangement pitch pt1, and an arrangement pitch of the figures of the orthographic projections of the anode structures 413 of the plurality of sub-pixels having the same color on the base substrate 1 in the first arrangement direction X is a second arrangement pitch pt2. The first arrangement pitch pt1 is greater than the second arrangement pitch pt2.

It should be noted that herein, unless otherwise specified, the expressions "arrangement pitch", "pitch" and so on refer to an arrangement period of periodically arranged structures, elements or components in a certain direction. The arrangement period may be represented by a center distance of two structures, elements or components adjacent in the direction.

It should be noted that herein, the expression "second arrangement pitch" refers to a minimum center distance of the figures of the orthographic projections of the anode structures having the same shape (i.e., in translational coincidence) on the base substrate in the first arrangement direction X. For example, the anode structures having the same shape (i.e., in translational coincidence) may belong to sub-pixels located in different sub-pixel rows. For example, in the example shown in FIG. 4A, the second arrangement pitch pt2 is the minimum center distance, in the first arrangement direction X, between the figure of the orthographic projection of the anode structure of a first color sub-pixel in the $n^{th}$ row of sub-pixels 011 and the figure of the orthographic projection of the anode structure of another first color sub-pixel in the (n+2)$^{th}$ row of sub-pixels 012.

For at least one type of sub-pixels having the same color (e.g., the third color sub-pixels SP3) among the plurality of sub-pixels, an arrangement pitch of the figures of the orthographic projections of the openings 103 of the plurality of sub-pixels having the same color on the base substrate 1 in the second arrangement direction Y is a third arrangement pitch pt3, and an arrangement pitch of the figures of the orthographic projections of the anode structures 413 of the plurality of sub-pixels having the same color on the base substrate 1 in the second arrangement direction Y is a fourth arrangement pitch pt4. The third arrangement pitch pt3 is greater than the fourth arrangement pitch pt4.

It should be noted that herein, the expression "fourth arrangement pitch" refers to a minimum center distance of the figures of the orthographic projections of the anode structures having the same shape (i.e., in translational coincidence) on the base substrate in the second arrangement direction Y. For example, the anode structures having the same shape (i.e., in translational coincidence) may belong to sub-pixels located in different sub-pixel columns. For example, in the example shown in FIG. 4A, the fourth arrangement pitch pt4 is the minimum center distance, in the second arrangement direction Y, between the figure of the orthographic projection of the anode structure of a first color sub-pixel in the m$^{th}$ column of sub-pixels 031 and the figure of the orthographic projection of the anode structure of another first color sub-pixel in the (m+2)$^{th}$ column of sub-pixels 032.

For at least one type of sub-pixels having the same color (e.g., the third color sub-pixels SP3) among the plurality of sub-pixels, an arrangement pitch of the figures of the orthographic projections of the openings 103 of the plurality of sub-pixels having the same color on the base substrate 1 in the first direction M1 is a first pitch pal, and an arrangement pitch of the figures of the orthographic projections of the anode structures 413 of the plurality of sub-pixels having the same color on the base substrate 1 in the first direction M1 is a second pitch pt12. The first pitch pt11 is greater than the second pitch pt12.

For at least one type of sub-pixels having the same color among the plurality of sub-pixels (e.g., the third color sub-pixels SP3), an arrangement pitch of the figures of the orthographic projections of the openings 103 of the plurality of sub-pixels having the same color on the base substrate 1 in the second direction M2 is a third pitch pt13, and an arrangement pitch of the figures of the orthographic projections of the anode structures 413 of the plurality of sub-pixels having the same color on the base substrate 1 in the second direction M2 is a fourth pitch pt14. The third pitch pt13 is greater than the fourth pitch pt14.

In the embodiments of the present disclosure, the first arrangement pitch pt1 is m times of the second arrangement pitch pt2, and m is greater than or equal to 1.5. For example, in the embodiments shown in FIG. 4A, the first arrangement pitch pt1 is about four times of the second arrangement pitch pt2. In other embodiments, the first arrangement pitch pt1 is about two times of the second arrangement pitch pt2.

The third arrangement pitch pt3 is n times of the fourth arrangement pitch pt4, and n is greater than or equal to 1.5. For example, in the embodiments shown in FIG. 4A, the third arrangement pitch pt3 is about four times of the fourth arrangement pitch pt4. In other embodiments, the third arrangement pitch pt3 is about two times of the fourth arrangement pitch pt4.

The first pitch pt11 is p times of the second pitch pt12, and p is greater than or equal to 1.5. For example, in the embodiments shown in FIG. 4A, the first pitch pt11 is about two times of the second pitch pt12.

The third pitch pt13 is q times of the fourth pitch pt14, and q is greater than or equal to 1.5. For example, in the embodiments shown in FIG. 4A, the third pitch pt13 is about two times of the fourth pitch pt14.

In the embodiments of the present disclosure, the anode structures corresponding to the openings or light emitting regions having a special shape are designed to have a regular shape, such as a rectangle, a circle, etc., to reduce an arrangement period (i.e., arrangement pitch) of the anode structures, so that interferometric fringes are invisible to human eyes, as shown in FIG. 6. Then, the use experience of the display substrate may be significantly improved.

For example, referring to FIG. 8C, the orthographic projection of the opening of at least some sub-pixels (for example, the third color sub-pixels SP3) on the base substrate 1 has an irregular shape, such as a D-shape. In contrast, the orthographic projection of the third anode structure 403 of the third color sub-pixel SP3 on the base substrate 1 has a regular shape, such as a rectangle or a rounded rectangle.

For example, referring to FIG. 8D, the orthographic projection of the opening of at least some sub-pixels (for example, the third color sub-pixels SP3) on the base substrate 1 has an irregular shape, such as a D-shape. In contrast, the orthographic projection of the third anode structure 403 of the third color sub-pixel SP3 on the base substrate 1 has a regular shape, such as a circle.

It should be understood that the embodiments shown in FIG. 8C and FIG. 8D may have the same advantages as those shown in FIG. 4A or FIG. 8A, which will not be repeated here.

Some exemplary embodiments of the present disclosure will be described in more detail below with reference to FIG. 9A to FIG. 11B. It should be noted that differences from the above embodiments will be mainly described below. In a case of no conflict, the embodiments described above may be arbitrarily combined with the following embodiments.

Referring to FIG. 9A and FIG. 9B, for at least some sub-pixels in the plurality of sub-pixels, the orthographic projection of the opening on the base substrate has a shape of water droplet, and the orthographic projection of the anode structure on the base substrate has a shape of rugby.

For example, in the embodiments shown in FIG. 9A, the at least some sub-pixels include the first color sub-pixels SP1. For at least some first color sub-pixels SP1, the opening (i.e., the first opening) 101 of each sub-pixel includes a body portion 101A and an auxiliary portion 101B. An orthographic projection of the body portion 101A of the opening on the base substrate 1 is a circle, and an orthographic projection of the auxiliary portion 101B of the opening on the base substrate 1 protrudes in the second direction M2 with respect to the circle. The anode structure (i.e., the first anode structure) 401 covering the opening having the body portion 101A and the auxiliary portion 101B includes a body portion 401A and two auxiliary portions 401B. An orthographic projection of the body portion 401A of the anode structure on the base substrate 1 is a circle, and orthographic projections of the two auxiliary portions 401B of the anode structure on the base substrate 1 protrude oppositely in the second direction M2 with respect to the circle.

For example, the openings of the at least some first color sub-pixels SP1 include at least two types of openings. In different types of openings, protruding directions of the auxiliary portion 101B of the opening with respect to the body portion 101A of the opening are different from each other. For example, the at least two types of openings include a first type of openings 1101 and a second type of openings 1102. The protruding direction of the auxiliary portion 101B in the first type of openings 1101 with respect to the body portion 101A is opposite to the protruding direction of the auxiliary portion 101B in the second type of openings 1102 with respect to the body portion 101A. For example, referring to FIG. 9A, in the first type of openings 1101, the protruding direction of the auxiliary portion 101B with respect to the body portion 101A is a lower right direction; in the second type of openings 1102, the protruding direction of the auxiliary portion 101B with respect to the body portion 101A is an upper left direction.

Similarly, the figures of the orthographic projections of the anode structures respectively covering different types of openings on the base substrate 1 are in translational coincidence with each other. For example, the figure of the orthographic projection of the anode structure covering the first type of openings 1101 on the base substrate is in translational coincidence with the figure of the orthographic projection of the anode structure covering the second type of openings 1102 on the base substrate.

Continuing to refer to FIG. 9A and FIG. 9B, the at least some sub-pixels include the third color sub-pixels SP3. For at least some third color sub-pixels SP3, the opening (i.e., the third opening) 103 of each sub-pixel includes a body portion 103A and an auxiliary portion 103B. An orthographic projection of the body portion 103A of the opening on the base substrate 1 is a circle, and an orthographic projection of the auxiliary portion 103B of the opening on the base substrate 1 protrudes in the first direction M1 with respect to the circle. The anode structure (i.e., the third anode structure) 403 covering the opening having the body portion 103A and the auxiliary portion 103B includes a body portion 403A and two auxiliary portions 403B. An orthographic projection of the body portion 403A of the anode structure on the base substrate 1 is a circle, and orthographic projections of the two auxiliary portions 403B of the anode structure on the base substrate 1 protrude oppositely in the first direction M1 with respect to the circle.

For example, the openings of at least some third color sub-pixels SP3 include at least two types of openings. In different types of openings, protruding directions of the auxiliary portion 103B of the opening with respect to the body portion 103A of the opening are different from each other. For example, the at least two types of openings include a third type of opening 1103 and a fourth type of opening 1104. The protruding direction of the auxiliary portion 103B in the third type of opening 1103 with respect to the body portion 103A is opposite to the protruding direction of the auxiliary portion 103B in the fourth type of opening 1104 with respect to the body portion 103A. For example, referring to FIG. 9A, in the third type of opening 1103, the protruding direction of the auxiliary portion 103B with respect to the body portion 103A is a lower left direction; in the fourth type of opening 1104, the protruding direction of the auxiliary portion 103B with respect to the body portion 103A is an upper right direction.

Similarly, the figures of the orthographic projections of the anode structures respectively covering different types of openings on the base substrate 1 are in translational coincidence with each other. For example, the figure of the orthographic projection of the anode structure covering the third type of opening 1103 on the base substrate is in translational coincidence with the figure of the orthographic projection of the anode structure covering the fourth type of opening 1104 on the base substrate.

Referring to FIG. 9A, for the $n^{th}$ row of sub-pixels and the $(n+2)^{th}$ row of sub-pixels, all the first color sub-pixels SP1 in the $n^{th}$ row of sub-pixels include the first type of openings 1101, and all the first color sub-pixels SP1 in the $(n+2)^{th}$ row of sub-pixels include the second type of openings 1102.

For the $m^{th}$ column of sub-pixels and the $(m+2)^{th}$ column of sub-pixels, all the first color sub-pixels SP1 in the $m^{th}$ column of sub-pixels include the first type of openings 1101, and all the first color sub-pixels SP1 in the $(m+2)^{th}$ column of sub-pixels include the second type of openings 1102.

In at least one row of first color sub-pixels SP1 arranged in the second direction M2, the first type of openings 1101 and the second type of openings 1102 are alternately arranged in the second direction M2.

For the $n^{th}$ row of sub-pixels and the $(n+2)^{th}$ row of sub-pixels, all the third color sub-pixels SP3 in the $n^{th}$ row of sub-pixels include the third type of openings 1103, and all the third color sub-pixels SP3 in the $(n+2)^{th}$ row of sub-pixels include the fourth type of openings 1104.

For the $m^{th}$ column of sub-pixels and the $(m+2)^{th}$ column of sub-pixels, all the third color sub-pixels SP3 in the $m^{th}$ column of sub-pixels include the third type of openings 1103, and all the third color sub-pixels SP3 in the $(m+2)^{th}$ column of sub-pixels include the fourth type of openings 1104.

In at least one row of third color sub-pixels SP3 arranged in the first direction M1, the third type of openings 1103 and the fourth type of openings 1104 are alternately arranged in the first direction M1.

Continuing to refer to FIG. 9A, at least one of the figure of the orthographic projection of the first type of opening 1101 on the base substrate 1 and the figure of the orthographic projection of the second type of opening on the base substrate 1 is only symmetrical with respect to the first symmetry axis AX1 extending in the second direction M2. The figure of the orthographic projection of each anode structure respectively covering the first type of opening 1101 and the second type of opening 1102 on the base substrate 1 is symmetrical with respect to the first symmetry axis AX1 extending in the second direction M2 and a second symmetry axis AX2 extending in the first direction M1.

At least one of the figure of the orthographic projection of the third type of opening on the base substrate 1 and the figure of the orthographic projection of the fourth type of opening on the base substrate 1 is only symmetrical with respect to the second symmetry axis AX2 extending in the first direction M1. The figure of the orthographic projection of each anode structure respectively covering the third type of opening 1103 and the fourth type of opening 1104 on the base substrate 1 is symmetrical with respect to the second symmetry axis AX2 extending in the first direction M1 and the first symmetry axis AX1 extending in the second direction M2.

For at least some sub-pixels in the plurality of sub-pixels, the geometric center of the figure of the orthographic projection of the anode structure of each sub-pixel on the base substrate does not coincide with the geometric center of the figure of the orthographic projection of the opening of the sub-pixel on the base substrate. For example, with reference to FIG. 9A, for at least some first color sub-pixels SP1 and at least some third color sub-pixels SP3, the geometric center O2 of the figure of the orthographic projection of the anode structure on the base substrate 1 is an intersection point of the two symmetry axes AX1 and AX2. The geometric center O1 of the water droplet-shaped opening does not coincide with the intersection point O2 of the symmetry axes AX1 and AX2.

Referring to FIG. 9A, for at least some sub-pixels in the plurality of sub-pixels, the geometric center O2 of the figure of the orthographic projection of the anode structure of at least one sub-pixel (for example, the first color sub-pixel SP1) on the base substrate 1 is offset in the second direction M2 with respect to the geometric center O1 of the figure of the orthographic projection of the opening 101 of the sub-pixel on the base substrate 1; and/or the geometric center O2 of the figure of the orthographic projection of the anode structure of at least one sub-pixel (for example, the third color sub-pixel SP3) on the base substrate 1 is offset in the first direction to M1 with respect to the geometric center O1 of the figure of the orthographic projection of the opening 103 of the sub-pixel on the base substrate 1.

Referring to FIG. 9A, for at least one type of sub-pixels having the same color (e.g., the first color sub-pixels SP1 and the third color sub-pixels SP3) among the plurality of sub-pixels, an arrangement pitch of the figures of the orthographic projections of the openings 101, 103 of the plurality of sub-pixels having the same color on the base substrate 1 in the second arrangement direction Y is a third arrangement pitch pt3. An arrangement pitch of the figures of the orthographic projections of the anode structures 401, 403 of the plurality of sub-pixels having the same color on the base substrate 1 in the second arrangement direction Y is a fourth arrangement pitch pt4. The third arrangement pitch pt3 is greater than the fourth arrangement pitch pt4.

For at least one type of sub-pixels having the same color (e.g., the third color sub-pixels SP3) among the plurality of sub-pixels, an arrangement pitch of the figures of the orthographic projections of the openings 103 of the plurality of sub-pixels having the same color on the base substrate 1 in the first direction M1 is a first pitch pt11. An arrangement pitch of the figures of the orthographic projections of the anode structures 403 of the plurality of sub-pixels having the same color on the base substrate 1 in the first direction M1 is a second pitch pt12. The first pitch pt11 is greater than the second pitch pt12.

For at least one type of sub-pixels having the same color (e.g., the first color sub-pixels SP1) among the plurality of sub-pixels, an arrangement pitch of the figures of the orthographic projections of the openings 101 of the plurality of sub-pixels having the same color on the base substrate 1 in the second direction M2 is a third pitch pt13. An arrangement pitch of the figures of the orthographic projections of the anode structures 401 of the plurality of sub-pixels having the same color on the base substrate 1 in the second direction M2 is a fourth pitch pt14. The third pitch pt13 is greater than the fourth pitch pt14.

In the embodiments of the present disclosure, the third arrangement pitch pt3 is n times of the fourth arrangement pitch pt4, and n is greater than or equal to 1.5. For example, in the embodiments shown in FIG. 9A, the third arrangement pitch pt3 is about two times of the fourth arrangement pitch pt4.

The first pitch pt11 is p times of the second pitch pt12, and p is greater than or equal to 1.5. For example, in the embodiments shown in FIG. 9A, the first pitch pt11 is about two times of the second pitch pt12.

The third pitch pt13 is q times of the fourth pitch pt14, and q is greater than or equal to 1.5. For example, in the embodiments shown in FIG. 9A, the third pitch pt13 is about two times of the fourth pitch pt14.

In the embodiments of the present disclosure, for the openings or light emitting regions having a special shape, the corresponding anode structures are designed to have a same shape to reduce an arrangement period (i.e., arrangement pitch) of the anode structures, so that interferometric fringes are invisible to human eyes, and the use experience of the display substrate may be significantly improved.

Referring to FIG. 10A and FIG. 10B, for at least some sub-pixels in the plurality of sub-pixels, the orthographic projection of the opening on the base substrate is a polygon, and the orthographic projection of the anode structure on the base substrate is a rectangle. For example, for at least some sub-pixels in the plurality of sub-pixels, the figure of the orthographic projection of the opening of each sub-pixel on the base substrate is a polygon 500, such as a pentagon. The polygon has a first vertex angle 501 and a first side 502 opposite to the first vertex angle 501. The figure of the orthographic projection of the anode structure of each sub-pixel on the base substrate is a rectangle.

For example, the at least some sub-pixels include a first color sub-pixel SP1, a second color sub-pixel SP2, and a third color sub-pixel SP3.

The openings having the first vertex angle 501 and configured to define the light emitting regions of the sub-pixels having the same color include at least two types of openings. In different types of openings, directions from a vertex of the first vertex angle 501 to the first side 502 opposite to the first vertex angle 501 are different from each other. For example, the first color sub-pixels SP1 include a first type of opening 5001 and a second type of opening 5002. In the first type of opening 5001, the direction from the vertex of the first vertex angle 501 to the first side 502 opposite to the first vertex angle 501 is upward in the second arrangement direction Y. In the second type of opening 5002, the direction from the vertex of the first vertex angle 501 to the first side 502 opposite to the first vertex angle 501 is downward in the second arrangement direction Y. The second color sub-pixel SP2 or the third color sub-pixel SP3 has a similar configuration.

The figures of the orthographic projections of the anode structures respectively covering different types of openings on the base substrate 1 are in translational coincidence with each other.

For example, for an $n^{th}$ row of sub-pixels 011' and an $(n+1)^{th}$ row of sub-pixels 012', in the $n^{th}$ row of sub-pixels 011', one type of openings (for example, the first type of openings 5001) in at least two types of openings are arranged in the first arrangement direction X; in the $(n+1)^{th}$ row of sub-pixels 012', another type of openings (for example, the second type of openings 5002) in the at least two types of openings are arranged in the first arrangement direction X.

For example, two types of openings 5001 and 5002 of adjacent sub-pixels having the same color are in a mirror arrangement. Since the first color sub-pixel SP1, the second color sub-pixel SP2 and the third color sub-pixel SP3 form a regular arrangement and the sub-pixels having the same color are very close in position, the sub-pixels having the same color in adjacent rows may be formed by evaporation using a same hole of a same metal mask after the anode structures are completed respectively.

For the $n^{th}$ row of sub-pixels 011' and the $(n+1)^{th}$ row of sub-pixels 012', the figures of the orthographic projections of the anode structures of two sub-pixels in the same column on the base substrate are in translational coincidence with each other.

For example, in the embodiments shown in FIG. 10A, the geometric centers of the first color sub-pixels SP1 in a same row or same column are located on a same straight line, the geometric centers of the second color sub-pixels SP2 in a same row or same column are located on a same straight line, and the geometric centers of the third color sub-pixels SP3 in a same row or same column are located on a same straight line. Based on such arrangements, the sub-pixels having different colors may be uniformly distributed in the overall display panel, so that the uniformity of display effect may be ensured, a high-quality picture display may be obtained, and the preparation process of the pixel structure may be simplified.

Referring to FIG. 10A, for at least one type of sub-pixels having the same color among the plurality of sub-pixels, an arrangement pitch of the figures of the orthographic projections of the opening 101, 102 and 103 of the plurality of sub-pixels having the same color on the base substrate 1 in the second arrangement direction Y is a third arrangement pitch pt3, and an arrangement pitch of the figures of the orthographic projections of the anode structures 401, 402 and 403 of the plurality of sub-pixels having the same color on the base substrate 1 in the second arrangement direction Y is a fourth arrangement pitch pt4. The third arrangement pitch pt3 is greater than the fourth arrangement pitch pt4.

In the embodiments of the present disclosure, the third arrangement pitch pt3 is n times of the fourth arrangement pitch pt4, and n is greater than or equal to 1.5. For example, in the embodiments shown in FIG. 10A, the third arrangement pitch pt3 is about two times of the fourth arrangement pitch pt4.

In the embodiments of the present disclosure, for the openings or light emitting regions having a special shape, the corresponding anode structures are designed to have a same shape to reduce an arrangement period (i.e., arrangement pitch) of the anode structures, so that interferometric fringes are invisible to human eyes, and the use experience of the display substrate may be significantly improved.

Referring to FIG. 11A and FIG. 11B, for at least some sub-pixels in the plurality of sub-pixels, the openings include two sub-openings in a mirror arrangement. The orthographic projection of each sub-opening on the base substrate is a polygon, such as triangle. The orthographic projection of the anode structure on the base substrate is a polygon, such as quadrilateral, rhombus, or quasi-rhombus. For example, the orthographic projection of each sub-opening on the base substrate is a polygon, such as triangle. The polygon has a first vertex angle 601 and a second side 602 opposite to the first vertex angle 601.

For example, the at least some sub-pixels include the first color sub-pixels SP1.

The openings having the first vertex angles 601 and configured to define the light emitting regions of the sub-pixels having the same color include at least two types of openings. In different types of openings, directions from a vertex of the first vertex angle 601 to the first side 602 opposite to the first vertex angle 601 are different from each other. For example, the first color sub-pixels SP1 include a first type of opening 6001 and a second type of opening 6002.

The first type of opening 6001 includes two sub-openings 60011 and 60012. In the sub-opening 60011, the direction from the vertex of the first vertex angle 601 to the first side 602 opposite to the first vertex angle 601 is downward in the second arrangement direction Y. In the sub-opening 60012, the direction from the vertex of the first vertex angle 601 to the first side 602 opposite to the first vertex angle 601 is upward in the second arrangement direction Y. The two sub-openings 60011 and 60012 exhibits a mirror symmetry with respect to the first symmetry axis AX1 extending in the first arrangement direction X.

The second type of opening 6002 includes two sub-openings 60013 and 60014. In the sub-opening 60013, the direction from the vertex of the first vertex angle 601 to the first side 602 opposite to the first vertex angle 601 is rightward in the first arrangement direction X. In the sub-opening 60014, the direction from the vertex of the first vertex angle 601 to the first side 602 opposite to the first vertex angle 601 is leftward in the first arrangement direction X. The two sub-openings 60013 and 60014 exhibits a mirror symmetry with respect to the second symmetry axis AX2 extending in the second arrangement direction Y.

The figures of the orthographic projections of the anode structures respectively covering different types of openings on the base substrate 1 are in translational coincidence with each other.

For example, for the $n^{th}$ row of sub-pixels 011 and the $(n+2)^{th}$ row of sub-pixels 012, in the $n^{th}$ row of sub-pixels 011, one type of openings (for example, the first type of openings 6001) in at least two types of openings are arranged in the first arrangement direction X; in the $(n+2)^{th}$ row of sub-pixels 012, another type of openings (for example, the second type of openings 6002) in the at least two types of openings are arranged in the first arrangement direction X.

For the $n^{th}$ row of sub-pixels 011 and the $(n+2)^{th}$ row of sub-pixels 012, the figures of the orthographic projections of the anode structures of two sub-pixels in the same column on the base substrate are in translational coincidence with each other.

Referring to FIG. 11A, for at least one type of sub-pixels having the same color among the plurality of sub-pixels, an arrangement pitch of the figures of the orthographic projections of the openings 101 of the plurality of sub-pixels having the same color on the base substrate 1 in the second arrangement direction Y is a third arrangement pitch pt3, and an arrangement pitch of the figures of the orthographic projections of the anode structures 401 of the plurality of sub-pixels having the same color on the base substrate 1 in the second arrangement direction Y is a fourth arrangement pitch pt4. The third arrangement pitch pt3 is greater than the fourth arrangement pitch pt4.

In the embodiments of the present disclosure, the third arrangement pitch pt3 is n times of the fourth arrangement pitch pt4, and n is greater than or equal to 1.5. For example, in the embodiments shown in FIG. 11A, the third arrangement pitch pt3 is about two times of the fourth arrangement pitch pt4.

In the embodiments of the present disclosure, for the openings or light emitting regions having a special shape, the corresponding anode structures are designed to have a same shape to reduce an arrangement period (i.e., arrangement pitch) of the anode structures, so that interferometric fringes are invisible to human eyes, and the use experience of the display substrate may be significantly improved.

Referring back to FIG. 1 and FIG. 2, at least some embodiments of the present disclosure further provide a display device. The display device may include the display substrate as described above.

The display device may include any apparatus or product having a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a headmounted device, electronic clothing, electronic bracelet, electronic necklace, electronic accessory, electronic tattoo or smart watch), a television, and so on.

Although some embodiments of a general technical concept of the present disclosure have been illustrated and described, it should be understood by those ordinary skilled in the art that changes may be made to these embodiments without departing from the principle and spirit of the general technical concept of the present disclosure. The scope of the present disclosure is defined by the claims and their equivalents.

What is claimed is:

1. A display substrate, comprising:
   a base substrate;
   a plurality of sub-pixels arranged on the base substrate in an array in a first arrangement direction and a second arrangement direction, wherein the plurality of sub-pixels comprise a plurality of light emitting regions;
   a first electrode layer located on the base substrate, wherein the first electrode layer comprises a plurality of anode structures; and
   a pixel definition layer located on a side of the first electrode layer away from the base substrate, wherein the pixel definition layer comprises a plurality of openings to define the plurality of light emitting regions,
   wherein for at least some sub-pixels in the plurality of sub-pixels, an orthographic projection of the opening of each sub-pixel on the base substrate falls into an orthographic projection of the anode structure of the sub-pixel on the base substrate, a figure of the orthographic projection of the opening of each sub-pixel on the base substrate has a different shape from a figure of the orthographic projection of the anode structure of the sub-pixel on the base substrate; and the figure of the orthographic projection of the anode structure of each sub-pixel on the base substrate has a greater number of symmetry axes than the figure of the orthographic projection of the opening of the sub-pixel on the base substrate.

2. The display substrate according to claim 1, wherein for at least some sub-pixels in the plurality of sub-pixels, the figure of the orthographic projection of the anode structure of each sub-pixel on the base substrate is non-proportionally enlarged with respect to the figure of the orthographic projection of the opening of the sub-pixel on the base substrate.

3. The display substrate according to claim 1, wherein for at least some sub-pixels in the plurality of sub-pixels, a geometric center of the figure of the orthographic projection of the anode structure of each sub-pixel on the base substrate does not coincide with a geometric center of the figure of the orthographic projection of the opening of the sub-pixel on the base substrate.

4. The display substrate according to claim 3, wherein for at least some sub-pixels in the plurality of sub-pixels, the geometric center of the figure of the orthographic projection of the anode structure of at least one sub-pixel on the base substrate is offset in the first arrangement direction with respect to the geometric center of the figure of the orthographic projection of the opening of the sub-pixel on the base substrate; and/or the geometric center of the figure of the orthographic projection of the anode structure of at least one sub-pixel on the base substrate is offset in the second arrangement direction with respect to the geometric center of the figure of the orthographic projection of the opening of the sub-pixel on the base substrate.

5. The display substrate according to claim 4, wherein for at least some sub-pixels in the plurality of sub-pixels, the geometric center of the figure of the orthographic projection of the anode structure of at least one sub-pixel on the base substrate is offset in a first direction with respect to the geometric center of the figure of the orthographic projection of the opening of the sub-pixel on the base substrate, and the first direction is inclined with respect to each of the first arrangement direction and the second arrangement direction; and/or
   for at least some sub-pixels in the plurality of sub-pixels, the geometric center of the figure of the orthographic projection of the anode structure of at least one sub-pixel on the base substrate is offset in a second direction with respect to the geometric center of the figure of the orthographic projection of the opening of the sub-pixel on the base substrate, the second direction is inclined with respect to each of the first arrangement direction and the second arrangement direction, and an included angle is formed between the second direction and the first direction.

6. The display substrate according to claim 5, wherein the figure of the orthographic projection of the opening of the sub-pixel on the base substrate has a first symmetry axis, a first vertex and a second vertex, the first vertex and the second vertex are located on the first symmetry axis, and the first vertex and the second vertex are arranged opposite to each other;
   the first symmetry axis and the figure of the orthographic projection of the anode structure of the sub-pixel on the base substrate have a first intersection point adjacent to the first vertex and a second intersection point adjacent to the second vertex; and
   in an extension direction of the first symmetry axis, a first distance between the first vertex and the first intersection point is not equal to a second distance between the second vertex and the second intersection point.

7. The display substrate according to claim 6, wherein, in a first cross-sectional view, the pixel definition layer on both sides of the opening of the sub-pixel covers parts of the anode structure of the sub-pixel respectively, a width of one part of the anode structure covered by the pixel definition layer on one side of the opening of the sub-pixel is not equal to a width of the other part of the anode structure covered by the pixel definition layer on the other side of the opening of the sub-pixel, a first cross section is perpendicular to a surface of the first electrode layer in contact with the pixel definition layer, and the first symmetry axis is located on the first cross section.

8. The display substrate according to claim 4, wherein for at least some sub-pixels in the plurality of sub-pixels, the figure of the orthographic projection of the opening of each sub-pixel on the base substrate has a shape obtained by cutting off at least one vertex angle from a polygon; and the figure of the orthographic projection of the anode structure of the sub-pixel on the base substrate is the polygon or a circle.

9. The display substrate according to claim 8, wherein the figure of the opening having the shape obtained by cutting off the at least one vertex angle from the polygon comprises a plurality of corner portions, the plurality of corner portions comprise a first corner portion and a second corner portion, the first corner portion is formed by cutting off a vertex angle between two sides of the polygon, and the second corner portion is opposite to the first corner portion.

10. The display substrate according to claim 9, wherein the figure of the opening having the shape obtained by cutting off the at least one vertex angle from the polygon has a first symmetry axis, a first vertex and a second vertex, the first vertex is a point where the first symmetry axis intersects the first corner portion, and the second vertex is a point where the first symmetry axis intersects the second corner portion;

the first symmetry axis and the figure of the orthographic projection of the anode structure of the sub-pixel on the base substrate have a first intersection point adjacent to the first vertex and a second intersection point adjacent to the second vertex; and in an extension direction of the first symmetry axis, a first distance between the first vertex and the first intersection point is greater than a second distance between the second vertex and the second intersection point, wherein the opening having the first corner portion is configured to define a light emitting region of at least one type of color sub-pixel, wherein the openings having the first corner portion and configured to define the light emitting regions of sub-pixels having a same color comprise at least two types of openings, and in different types of openings, directions from a vertex of the first corner portion to a vertex of a corner portion opposite to the first corner potion are different from each other; and the figures of the orthographic projections of the anode structures respectively covering different types of openings on the base substrate are in translational coincidence with each other, wherein the at least two types of openings comprise a first type of opening, a second type of opening, a third type of opening, and a fourth type of opening;

a direction from the first corner portion to the second corner portion in the first type of opening is opposite to a direction from the first corner portion to the second corner portion in the second type of opening, and a direction from the first corner portion to the second corner portion in the third type of opening is opposite to a direction from the first corner portion to the second corner portion in the fourth type of opening; and the figures of the orthographic projections of the anode structures respectively covering the first type of opening, the second type of opening, the third type of opening and the fourth type of opening on the base substrate are in translational coincidence with each other, for a $n^{th}$ row of sub-pixels and the $(n+2)^{th}$ row of sub-pixels, in the $n^{th}$ row of sub-pixels, the first type of opening and the second type of opening are alternately arranged in the first arrangement direction; in the $(n+2)^{th}$ row of sub-pixels, the third type of opening and the fourth type of opening are alternately arranged in the first arrangement direction; and/or for a $m^{th}$ column of sub-pixels and the $(m+2)^{th}$ column of sub-pixels, in the $m^{th}$ column of sub-pixels, the first type of opening and the second type of opening are alternately arranged in the second arrangement direction; in the $(m+2)^{th}$ column of sub-pixels, the third type of opening and the fourth type of opening are alternately arranged in the second arrangement direction, wherein for at least one first type of opening, two second type of openings are adjacent to the first type of opening in the first arrangement direction, two second type of openings are adjacent to the first type of opening in the second arrangement direction, two third type of openings are adjacent to the first type of opening in the first direction, and two fourth type of openings are adjacent to the first type of opening in the second direction.

11. The display substrate according to claim 4, wherein for at least some first color sub-pixels in the plurality of sub-pixels, the opening of each sub-pixel comprises a body portion and an auxiliary portion, an orthographic projection of the body portion of the opening on the base substrate is a circle, and an orthographic projection of the auxiliary portion of the opening on the base substrate protrudes in a second direction with respect to the circle; and the anode structure covering the opening having the body portion and the auxiliary portion comprises a body portion and two auxiliary portions, an orthographic projection of the body portion of the anode structure on the base substrate is a circle, and orthographic projections of the two auxiliary portions of the anode structure on the base substrate protrude oppositely in the second direction with respect to the circle, wherein the openings of the at least some first color sub-pixels comprise at least two types of openings, and in different types of openings, protruding directions of the auxiliary portion of the opening with respect to the body portion of the opening are different from each other, and the figures of the orthographic projections of the anode structures respectively covering different types of openings on the base substrate are in translational coincidence with each other, wherein the at least two types of openings comprise a first type of opening and a second type of opening;

the protruding direction of the auxiliary portion with respect to the body portion in the first type of opening is opposite to the protruding direction of the auxiliary portion with respect to the body portion in the second type of opening; and the figures of the orthographic projections of the anode structures respectively covering the first type of opening and the second type of opening on the base substrate are in translational coincidence with each other, wherein for at least some third color sub-pixels in the plurality of sub-pixels, the opening of each sub-pixel comprises a body portion and an auxiliary portion, an orthographic projection of the body portion of the opening on the base substrate is a circle, and an orthographic projection of the auxiliary portion of the opening on the base substrate protrudes in the first direction with respect to the circle; and the anode structure covering the opening having the body portion and the auxiliary portion comprises a body portion and two auxiliary portions, an orthographic projection of the body portion of the anode structure on the base substrate is a circle, and orthographic projections of the two auxiliary portions of the anode structure on the base substrate protrude oppositely in the first direction with respect to the circle, wherein the openings of the at least some third color sub-pixels comprise at least two types of openings, and in different types of openings, protruding directions of the auxiliary portion of the opening with respect to the body portion of the opening are different from each other, and the figures of the orthographic projections of the anode structures respectively covering different types of openings on the base substrate are in translational coincidence with each other, wherein the at least two types of openings comprise a third type of opening and a fourth type of opening;

the protruding direction of the auxiliary portion with respect to the body portion in the third type of opening is opposite to the protruding direction of the auxiliary portion with respect to the body portion in the fourth type of opening; and the figures of the orthographic projections of the anode structures respectively covering the third type of opening and the fourth type of opening on the base substrate are in translational coincidence with each other, wherein for a $n^{th}$ row of sub-pixels and the $(n+2)^{th}$ row of sub-pixels, the first color sub-pixels in the $n^{th}$ row of sub-pixels comprise the first type of openings, and the first color sub-pixels in the $(n+2)^{th}$ of sub-pixels comprise the second type of openings; and/or for a $m^{th}$ column of sub-pixels and the $(m+2)^{th}$ column of sub-pixels, the first color sub-pixels in the math column of sub-pixels comprise the first type of openings, and the first color sub-pixels in the $(m+2)^{th}$ column of sub-pixels comprise the second type of openings; and/or in at least one row of first color sub-pixels arranged in the second direction, the first type of openings and the second type of openings are alternately arranged in the second direction, wherein for the $n^{th}$ row of sub-pixels and the $(n+2)^{th}$ row of sub-pixels, the third color sub-pixels in the $n^{th}$ row of sub-pixels comprise the third type of openings, and the third color sub-pixels in the $(n+2)^{th}$ of sub-pixels comprise the fourth type of opening; and/or for the math column of sub-pixels and the $(m+2)^{th}$ column of sub-pixels, the third color sub-pixels in the math column of sub-pixels comprise the third type of openings, and the third color sub-pixels in the $(m+2)^{th}$ column of sub-pixels comprise the fourth type of openings; and/or in at least one row of third color sub-pixels arranged in the first direction, the third type of openings and the fourth type of openings are alternately arranged in the first direction, wherein at least one of the figure of the orthographic projection of the first type of opening on the base substrate and the figure of the orthographic projection of the second type of opening on the base substrate is only symmetrical with respect to a first symmetry axis extending in the second direction; the figure of the orthographic projection of the anode structure covering the first type of opening on the base substrate is symmetrical with respect to the first symmetry axis extending in the second direction and a second symmetry axis extending in the first direction, and the figure of the orthographic projection of the anode structure covering the second type of opening on the base substrate is symmetrical with respect to the first symmetry axis extending in the second direction and the second symmetry axis extending in the first direction; and/or at least one of the figure of the orthographic projection of the third type of opening on the base substrate and the figure of the orthographic projection of the fourth type of opening on the base substrate is only symmetrical with respect to the second symmetry axis extending in the first direction; the figure of the orthographic projection of the anode structure covering the third type of opening on the base substrate is symmetrical with respect to the second symmetry axis extending in the first direction and the first symmetry axis extending in the second direction, and the figure of the orthographic projection of the anode structure covering the fourth type of opening on the base substrate is symmetrical with respect to the second symmetry axis extending in the first direction and the first symmetry axis extending in the second direction.

12. The display substrate according to claim 4, wherein for at least some sub-pixels in the plurality of sub-pixels, the figure of the orthographic projection of the opening of each sub-pixel on the base substrate is a polygon, the polygon has a first vertex angle and a first side opposite to the first vertex angle; the figure of the orthographic projection of the anode structure of each sub-pixel on the base substrate is a rectangle, wherein the openings having the first vertex angle and configured to define the light emitting regions of sub-pixels having a same color comprise at least two types of openings, and in different types of openings, directions from a vertex of the first vertex angle to the first side opposite to the first vertex angle are different from each other; and the figures of the orthographic projections of the anode structures respectively covering different types of openings on the base substrate are in translational coincidence with each other, for an $n^{th}$ row of sub-pixels and an $(n+1)^{th}$ row of sub-pixels, in the $n^{th}$ row of sub-pixels, one type of openings in at least two types of openings are arranged in the first arrangement direction; in the $(n+1)^{th}$ row of sub-pixels, another type of openings in the at least two types of openings are arranged in the first arrangement direction; and for the $n^{th}$ row of sub-pixels and an $(n+1)^{th}$ row of sub-pixels, the figures of the orthographic projections of the anode structures of two sub-pixels in a same column on the base substrate are in translational coincidence with each other.

13. The display substrate according to claim 4, wherein for at least some sub-pixels in the plurality of sub-pixels, the opening of each sub-pixel comprises two sub-openings in a mirror arrangement, and the orthographic projection of the anode structure of the sub-pixel on the base substrate covers the orthographic projections of the two sub-openings in the mirror arrangement on the base substrate;

each of the orthographic projections of the two sub-openings on the base substrate is a polygon, and the polygon has a first vertex angle and a first side opposite to the first vertex angle, wherein the openings having the first vertex angle and configured to define the light emitting regions of sub-pixels having a same color comprise at least two types of openings, and in different types of openings, directions from a vertex of the first vertex angle to the first side opposite to the first vertex angle are different from each other; and the figures of the orthographic projections of the anode structures respectively covering different types of openings on the base substrate are in translational coincidence with each other, for a $n^{th}$ row of sub-pixels and a $(n+2)^{th}$ row of sub-pixels, in the $n^{th}$ row of sub-pixels, one type of openings in at least two types of openings are arranged in the first arrangement direction; in the $(n+2)^{th}$ row of sub-pixels, another type of openings in the at least two types of openings are arranged in the first arrangement direction; and for the $n^{th}$ row of sub-pixels and the $(n+2)^{th}$ row of sub-pixels, the figures of the orthographic projections of the anode structures of two sub-pixels in a same column on the base substrate are in translational coincidence with each other.

14. The display substrate according to claim 3, wherein the plurality of sub-pixels comprise an $n^{th}$ row of sub-pixels and an $(n+2)^{th}$ row of sub-pixels, and the $n^{th}$ row of sub-pixels and the $(n+2)^{th}$ row of sub-pixels are arranged in the second arrangement direction; and the $n^{th}$ row of sub-pixels comprise a first sub-pixel, the $(n+2)^{th}$ row of sub-pixels comprise a second sub-pixel closest to the first sub-pixel in the first arrangement direction and having a same color as the first sub-pixel, a figure of an orthographic projection of the opening of the first sub-pixel on the base substrate is not in translational coincidence with a figure of an orthographic projection of the opening of the second sub-pixel on the base substrate, and a figure of an orthographic projection of the anode structure of the first sub-pixel on the base substrate is in translational coincidence with a figure of an orthographic projection of the anode structure of the second sub-pixel on the base substrate.

15. The display substrate according to claim 14, wherein, in the sub-pixels having a same color in the $n^{th}$ row of sub-pixels and the $(n+2)^{th}$ row of sub-pixels, the figure of the orthographic projection of the opening of at least part of the sub-pixels on the base substrate is not in translational coincidence with the figure of the orthographic projection of the opening of the other part of the sub-pixels on the base substrate, and the figures of the orthographic projections of the anode structures of the sub-pixels on the base substrate are in translational coincidence with each other.

16. The display substrate according to claim 14, wherein the plurality of sub-pixels comprise an $m^{th}$ column of sub-pixels and an $(m+2)^{th}$ column of sub-pixels, and the $m^{th}$ column of sub-pixels and the $(m+2)^{th}$ column of sub-pixels are arranged in the first arrangement direction; and the $m^{th}$ column of sub-pixels comprise a third sub-pixel, the $(m+2)^{th}$ column of sub-pixels comprise a fourth sub-pixel closest to the third sub-pixel in the second arrangement direction and having a same color as the third sub-pixel, a figure of an orthographic projection of the opening of the third sub-pixel on the base substrate is not in translational coincidence with a figure of an orthographic projection of the opening of the fourth sub-pixel on the base substrate, and a figure of an orthographic projection of the anode structure of the third sub-pixel on the base substrate is in translational coincidence with a figure of an orthographic projection of the anode structure of the fourth sub-pixel on the base substrate.

17. The display substrate according to claim 16, wherein, in the sub-pixels having a same color in the $m^{th}$ column of sub-pixels and the $(m+2)^{th}$ column of sub-pixels, the figure of the orthographic projection of the opening of at least part of the sub-pixels on the base substrate is not in translational coincidence with the figure of the orthographic projection of the opening of the other part of the sub-pixels on the base substrate, and the figures of the orthographic projections of the anode structures of the sub-pixels on the base substrate are in translational coincidence with each other.

18. The display substrate according to claim 17, wherein for at least one type of sub-pixels having a same color among the plurality of sub-pixels, an arrangement pitch of the figures of the orthographic projections of the openings of a plurality of sub-pixels having the same color on the base substrate in the first arrangement direction is a first arrangement pitch, an arrangement pitch of the figures of the orthographic projections of the anode structures of the plurality of sub-pixels having the same color on the base substrate in the first arrangement direction is a second arrangement pitch, and the first arrangement pitch is greater than the second arrangement pitch; and/or for at least one type of sub-pixels having a same color among the plurality of sub-pixels, an arrangement pitch of the figures of the orthographic projections of the openings of a plurality of sub-pixels having the same color on the base substrate in the second arrangement direction is a third arrangement pitch, an arrangement pitch of the figures of the orthographic projections of the anode structures of the plurality of sub-pixels having the same color on the base substrate in the second arrangement direction is a fourth arrangement pitch, and the third arrangement pitch is greater than the fourth arrangement pitch; and/or for at least one type of sub-pixels having a same color among the plurality of sub-pixels, an arrangement pitch of the figures of the orthographic projections of the openings of a plurality of sub-pixels having the same color on the base substrate in the first direction is a first pitch, an arrangement pitch of the figures of the orthographic projections of the anode structures of the plurality of sub-pixels having the same color on the base substrate in the first direction is a second pitch, and the first pitch is greater than the second pitch; and/or for at least one type of sub-pixels having a same color among the plurality of sub-pixels, an arrangement pitch of the figures of the orthographic projections of the openings of a plurality of sub-pixels having the same color on the base substrate in the second direction is a third pitch, an arrangement pitch of the figures of the orthographic projections of the anode structures of the plurality of sub-pixels having the same color on the base substrate in the second direction is a fourth pitch, and the third pitch is greater than the fourth pitch.

19. The display substrate according to claim 18, wherein the first arrangement pitch is m times of the second arrangement pitch, and m is greater than or equal to 1.5; and/or the third arrangement pitch is n times of the fourth arrangement pitch, and n is greater than or equal to 1.5; and/or the first pitch is p times of the second pitch, and p is greater than or equal to 1.5; and/or the third pitch is q times of the fourth pitch, and q is greater than or equal to 1.5.

20. A display device, comprising the display substrate of claim 1.

* * * * *